(12) United States Patent
Iwao et al.

(10) Patent No.: US 8,791,030 B2
(45) Date of Patent: Jul. 29, 2014

(54) COATING TREATMENT METHOD AND COATING TREATMENT APPARATUS

(71) Applicant: Tokyo Electron Limited, Tokyo (JP)

(72) Inventors: Fumiko Iwao, Nirasaki (JP); Satoru Shimura, Nirasaki (JP); Kousuke Yoshihara, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/952,739

(22) Filed: Jul. 29, 2013

(65) Prior Publication Data

US 2014/0038423 A1  Feb. 6, 2014

(30) Foreign Application Priority Data

Aug. 2, 2012 (JP) ................. 2012-171605
Jun. 13, 2013 (JP) ................. 2013-124314

(51) Int. Cl.
*H01L 21/31* (2006.01)
*C23C 16/00* (2006.01)

(52) U.S. Cl.
USPC ............ 438/758; 438/763; 438/782; 118/720

(58) Field of Classification Search
USPC ......... 438/758, 761, 763, 778, 781, 782, 945; 118/720, 721
See application file for complete search history.

(56) References Cited

U.S. PATENT DOCUMENTS

| 5,939,139 | A * | 8/1999 | Fujimoto | 427/240 |
| 6,033,728 | A * | 3/2000 | Kikuchi et al. | 427/240 |
| 6,716,773 | B2 * | 4/2004 | Egami et al. | 438/798 |
| 6,777,350 | B2 * | 8/2004 | Nakagawa | 438/782 |
| 7,435,692 | B2 * | 10/2008 | Carcasi | 438/782 |
| 7,976,896 | B2 * | 7/2011 | Fukuda et al. | 427/240 |
| 8,186,298 | B2 * | 5/2012 | Ogata et al. | 118/320 |
| 2006/0272676 | A1 * | 12/2006 | Iwase et al. | 134/2 |

FOREIGN PATENT DOCUMENTS

| JP | 2010-118519 A | 5/2010 |
| WO | 2007/020979 A1 | 2/2007 |

* cited by examiner

*Primary Examiner* — Kevin M Picardat
(74) *Attorney, Agent, or Firm* — Posz Law Group, PLC

(57) ABSTRACT

In the present invention, a masking solution is supplied to an edge portion of a front surface of a substrate rotated around a vertical axis to form a masking film at the edge portion of the substrate, a hard mask solution is supplied to the front surface of the substrate to form a hard mask film on the front surface of the substrate, a hard mask film removing solution dissolving the hard mask film is supplied to the hard mask film formed at the edge portion of the substrate to remove the hard mask film formed at the edge portion of the substrate, and a masking film removing solution dissolving the masking film is supplied to the masking film to remove the masking film at the edge portion of the substrate.

21 Claims, 20 Drawing Sheets

COATING TREATMENT METHOD AND COATING TREATMENT APPARATUS

BACKGROUND OF THE INVENTION

1. Field of the Invention

This invention relates to a coating treatment method and a coating treatment apparatus that form a hard mask film on a front surface of a substrate and remove an edge portion of the hard mask film.

This application is based upon and claims the benefit of priority of the prior Japanese Patent Application No. 2012-171605, filed in Japan on Aug. 2, 2012, and Japanese Patent Application No. 2013-124314, filed in Japan on Jun. 13, 2013, the entire contents of which are incorporated herein by reference.

2. Description of the Related Art

Generally in a semiconductor manufacturing process, a photolithography process including a resist coating treatment of supplying a resist solution being a treatment solution to the front surface of the substrate, such as a semiconductor wafer while rotating the substrate horizontally held to form a resist film, exposure processing of exposing the resist film into a predetermined pattern, a developing treatment of developing the exposed resist film and so on is performed to form a predetermined resist pattern on the wafer. For example, a coating and developing treatment system in which an exposure apparatus is connected to a coating and developing treatment apparatus is usually used for the photolithography process.

In the photolithography process in the coating and developing treatment system, the multi-patterning technique of performing resist coating, exposure and developing treatment a plurality of times has been actively discussed with microfabrication of 20 nm or finer in recent years, but the etching technique becomes very difficult due to complication of the process.

Hence, to further improve the precision of the etching technique, a hard mask capable of providing a large selection ratio in etching is employed as a lower-layer film of an organic film and an inorganic film. As the hard mask, for example, a hard mask composed of an organic polymer or a metal hard mask containing an organic substance and an inorganic substance is employed. Further, a hard mask film (lower-layer film) of the hard mask is required to be formed by the spin coating method in consideration of cost and the like (see International Publication Pamphlet No. WO2007/020979).

In forming the hard mask film by the spin coating method, the hard mask film can be formed by supplying (discharging) a hard mask solution to the front surface of the substrate rotated around the vertical axis to diffuse the hard mask solution and then drying (baking) the hard mask solution. However, the hard mask solution flows around and adheres to a beveled portion at the edge portion of the substrate, that is, a portion obtained by chamfering a portion forming an elevation angle at the peripheral end portion of the substrate in the spin coating method. In particular, the hard mask containing an organic substance and an inorganic substance contains metal such as titanium, aluminum, tungsten or the like, so that if the adherence occurs, the substrate and the inside of the apparatus may be contaminated with metal.

As means for removing the hard mask film adhering to the beveled portion of the substrate, there is a conceivable method of discharging a cleaning solution (organic solvent for dissolving the hard mask film) to the beveled portion of the rotated substrate to remove the hard mask using an existing cleaning technique (Japanese Patent Laid-open Patent Publication No. 2010-118519) of cleaning the beveled portion of the substrate.

However, the hard mask film is formed by being applied to the front surface of the substrate and then dried (baked) and therefore cannot be sufficiently removed by the existing cleaning technique for the beveled portion of discharging the cleaning solution (organic solvent dissolving the hard mask film) to the beveled portion of the rotated substrate to remove the hard mask film, so that the hard mask film remains at the beveled portion of the substrate, and contamination by the hard mask film adhering to the substrate adversely affects subsequent treatments on the substrate, such as resist treatment, exposure processing, developing treatment and so on. Further, particularly the hard mask containing an organic substance and an inorganic substance has a problem of metallic contamination of the substrate and the inside of the apparatus.

SUMMARY OF THE INVENTION

This invention has been made in consideration of the above circumstances and its object is to prevent adherence of a hard mask solution to an edge portion of a substrate and to easily apply the hard mask.

To achieve the above object, the present invention is a coating treatment method of applying a hard mask solution to a front surface of a substrate to form a hard mask film, including: a masking film forming step of supplying a masking solution to an edge portion of the front surface of the substrate rotated around a vertical axis to form a masking film at the edge portion of the substrate; a hard mask film forming step of supplying the hard mask solution to the front surface of the substrate to form the hard mask film on the front surface of the substrate; a hard mask film removing step of supplying a hard mask film removing solution dissolving the hard mask film to the hard mask film formed at the edge portion of the substrate to remove the hard mask film at the edge portion of the substrate; and a masking film removing step of supplying a masking film removing solution dissolving the masking film to the masking film to remove the masking film at the edge portion of the substrate.

The present invention according to another aspect is a coating treatment method of applying a hard mask solution to a front surface of a substrate to form a hard mask film, including: a masking film forming step of supplying a masking solution to an edge portion of the front surface of the substrate rotated around a vertical axis to form a masking film at the edge portion of the substrate; a hard mask film forming step of supplying the hard mask solution to the front surface of the substrate to form the hard mask film on the front surface of the substrate; and a masking film removing step of supplying a masking film removing solution dissolving the masking film to the masking film to remove the masking film at the edge portion of the substrate and remove the hard mask film adhering to the masking film.

The present invention according to still another aspect is a coating treatment apparatus for applying a hard mask solution to a front surface of a substrate to form a hard mask film, including: a substrate holding part that horizontally holds the substrate; a rotation mechanism that rotates the substrate holding part around a vertical axis; a masking solution supply part that supplies a masking solution to an edge portion of the front surface of the substrate; a hard mask solution supply part that supplies the hard mask solution to the front surface of the substrate; a hard mask film removing solution supply part that supplies a hard mask film removing solution to the hard mask film formed at the edge portion of the substrate; a masking film removing solution supply part that supplies a masking film removing solution dissolving the masking film to remove the masking film formed at the edge portion of the front surface of the substrate; a first moving mechanism that moves the masking solution supply part between the edge portion of the substrate and an outside of the substrate; a second moving mechanism that moves the hard mask solution supply part between a hard mask solution supply position and an outside of the substrate; a third moving mechanism that moves the masking film removing solution supply part between the edge portion of the substrate and an outside of the substrate; a fourth moving mechanism that moves the hard mask film removing solution supply part between the edge portion of the substrate and au outside of the substrate; and a control unit that drives the rotation mechanism, the masking solution supply part, the hard mask solution supply part, and the first to fourth moving mechanisms. Further, the control unit is configured to supply the masking solution to the edge portion of the front surface of the rotated substrate to form the masking film at the edge portion of the substrate, then supply the hard mask solution to the front surface of the substrate to form the hard mask film on the front surface of the substrate, then supply the hard mask film removing solution dissolving the hard mask film to the hard mask film formed at the edge portion of the substrate to remove the hard mask film at the edge portion of the substrate, and then supply the masking film removing solution to the masking film to remove the masking film at the edge portion of the substrate.

The present invention according to yet another aspect is a coating treatment apparatus for applying a hard mask solution to a front surface of a substrate to form a hard mask film, including: a substrate holding part that horizontally holds the substrate; a rotation mechanism that rotates the substrate holding part around a vertical axis; a masking solution supply part that supplies a masking solution to an edge portion of the front surface of the substrate; a hard mask solution supply part that supplies the hard mask solution to the front surface of the substrate; a masking film removing solution supply part that supplies a masking film removing solution dissolving the masking film to remove the masking film formed at the edge portion of the front surface of the substrate; a first moving mechanism that moves the masking solution supply part between the edge portion of the substrate and an outside of the substrate; a second moving mechanism that moves the hard mask solution supply part between a hard mask solution supply position and an outside of the substrate; a third moving mechanism that moves the masking film removing solution supply part between the edge portion of the substrate and an outside of the substrate; and a control unit that drives the rotation mechanism, the masking solution supply part, the hard mask solution supply part, and the first to third moving mechanisms. Further, the control unit is configured to supply the masking solution to the edge portion of the front surface of the rotated substrate to form the masking film at the edge portion of the substrate, then supply the hard mask solution to the front surface of the substrate to form the hard mask film on the front surface of the substrate, and then supply the masking film removing solution to the masking film to remove the masking film at the edge portion of the substrate and remove the hard mask film adhering to the masking film.

According to the present invention, there is no adherence of a hard mask film to an edge portion of a substrate, thereby making it possible to prevent contamination by a hard mask film such as metallic contamination at the edge portion of the substrate and easily apply a hard mask solution.

DETAILED DESCRIPTION OF THE INVENTION

Hereinafter, embodiments of this invention will be described in detail based on the accompanying drawings. First, a configuration of a coating and developing treatment system to which a coating treatment apparatus according to this invention is applied will be described.

Figure 1:
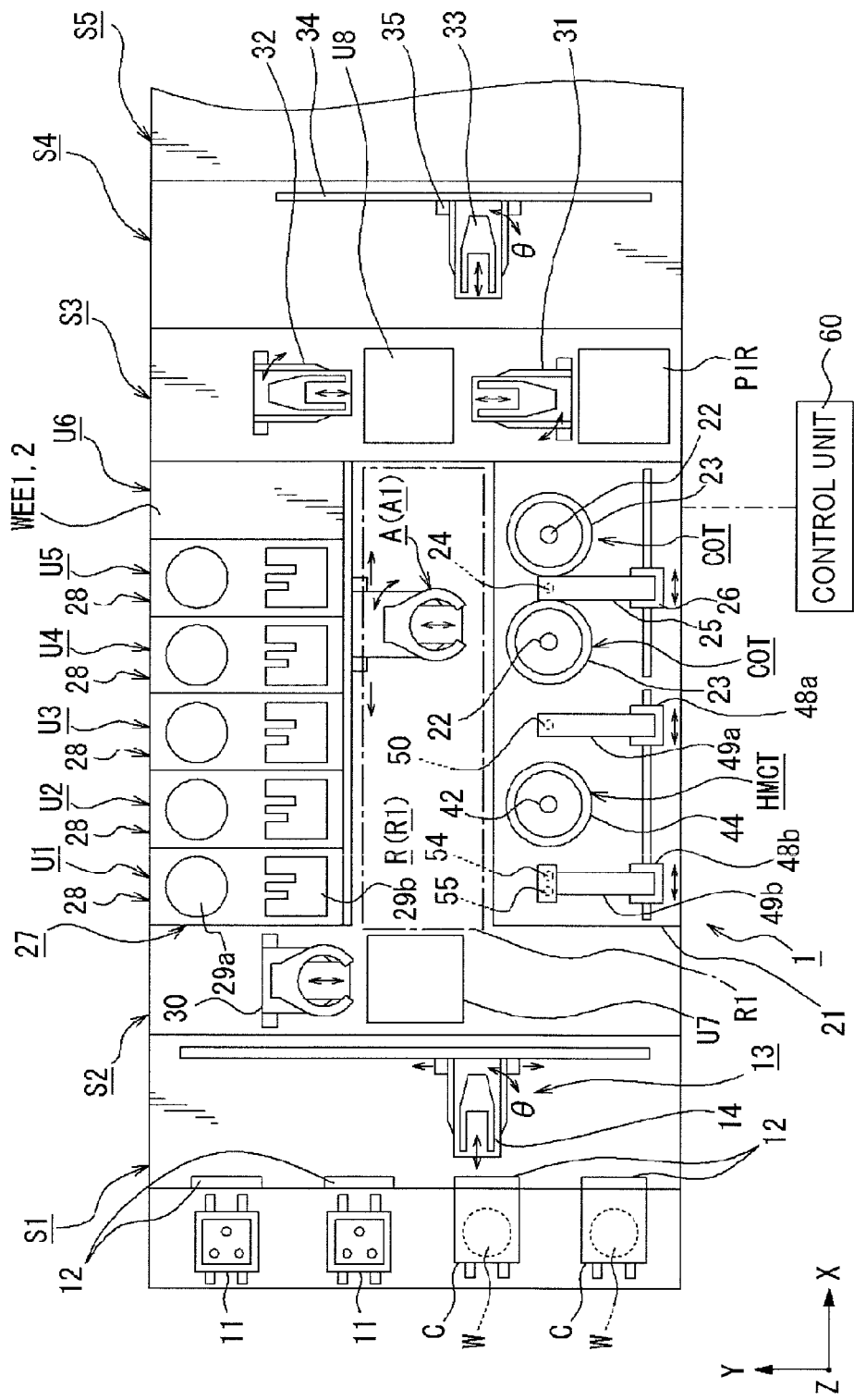
FIG. 1 is a schematic plan view illustrating the whole coating and developing treatment system in which an exposure apparatus is connected to a coating and developing treatment apparatus to which a coating treatment apparatus according to this invention is applied.

The coating and developing treatment system 1 according to an embodiment includes, as illustrated in FIG. 1, a carrier block S1 for carrying in-out a carrier C in which, for example, 25 wafers W being substrates are sealed and housed, a multi-purpose block S2, a treatment block S3 for performing treatment on the wafer W, and an interface block S4 which are linearly arranged. To the interface block S4, an exposure apparatus S5 performing liquid-immersion exposure is connected.

In the carrier block S1, mounting tables 11 for mounting the carriers C thereon, opening/closing parts 12 provided in a front wall surface as seen from the mounting tables 11, and a delivery arm 13 for taking the wafers W out of the carriers C via the opening/closing parts 12 are provided. The delivery arm 13 includes five wafer holding parts 14 in the vertical direction and is formed to be movable forward and backward in horizontal X- and Y-directions, movable up and down in a vertical Z-direction, rotatable in a θ-direction around the vertical axis and configured to be movable in an arrangement direction of the carriers C.

To the carrier block S1, the multi-purpose block S2 is connected. In the multi-purpose block S2, a shelf unit U7 in which a plurality of modules being later-described mounting parts each for mounting the wafer W thereon are sacked, and a pre-treatment delivery arm 30 which delivers the wafer W to/from each of the modules stacked in the shelf unit U7 are provided. The pre-treatment delivery arm 30 is formed to be movable forward and backward in the horizontal Y-directions and movable up and down in the vertical Z-direction.

Note that the places where the wafers W can be mounted are described as modules, among which modules that perform treatments such as heating, solution treatment, gas supply, or edge exposure are described as treatment modules. Further, among the treatment modules, a module that supplies a treatment solution or a cleaning solution to the wafer W is described as a solution treatment module, a module that performs heat treatment on the wafer W is described as a thermal treatment module, and a heating part constituting the thermal treatment module is described as a heating module.

To the multi-purpose block S2, the treatment block S3 is connected, and the treatment block S3 is composed of a first unit block B1 to a sixth unit block B6 each performing solution treatment on the wafer W which are stacked in order from the bottom. The first unit block B1 that is a unit block for pre-treatment performs formation of a hard mask film and formation of a resist film on the wafer W. Further, the second unit block B2 is similarly configured to perform formation of an anti-reflection film and formation of a resist film on the wafer W.

The third unit block B3 and the fourth unit block B4 being unit blocks for post-treatment are configured similarly to each other and perform formation of a protective film for liquid immersion exposure and cleaning on a rear surface side of the wafer W. The fifth unit block B5 and the sixth unit block B6 for developing treatment are configured similarly to each other and perform developing treatment on the wafer W after liquid immersion exposure. As described above, the unit blocks that perform treatments on the wafer W are provided at six floors. Further, the first unit block B1 to the fourth unit block B4 are called coating blocks and the fifth unit block B5 to the sixth unit block B6 are called developing blocks for convenience.

The first unit block B1 to the six unit block B6 respectively include solution treatment modules, heating modules, carrier arms A1 to A6 being carrier means for the unit blocks, and carry regions R1 to R6 in which the carrier arms A1 to A6 move, and arrangement layouts of them are similarly configured in the unit blocks B1 to B6. In the unit blocks B1 to B6, the wafers W are carried by the carrier arms A1 to A6 independently of each other and subjected to treatments. The carry regions R1 to R6 are linear carry paths extending from the carrier block S1 to the interface block S4. FIG. 1 illustrates the first unit block B 1, and the unit block B1 will be described below as representative.

At the center of the first unit block B 1, the carry region R1 is formed. On the right and left sides of the carry region R1 as seen from the carrier block S1 to the interface block S4 side, a solution treatment module 21 and shelf units U1 to U6 are arranged respectively.

In the solution treatment module 21, a hard mask film forming module HMCT and two resist film forming modules COT are provided, and the hard mask film forming module HMCT and the two resist film forming modules COT are arranged in this order from the carrier block S1 side to the interface block S4 side. The resist film forming module COT includes a spin chuck 22, and the spin chuck 22 is configured to suction-hold a central portion of a rear surface of the wafer W and to be rotatable around the vertical axis. In the drawing, a numeral 23 denotes a treatment cup opened on the upper side. The treatment cup 23 surrounds the spin chuck 22 to suppress scattering of the treatment solution. For treating the wafer W, the wafer W is housed in the treatment cup 23, and the central portion of the rear surface of the wafer W is held on the spin chuck 22.

In the resist film forming modules COT, a nozzle 24 commonly used in both the modules is provided. A numeral 25 in the drawing denotes an arm that supports the nozzle 24, and a numeral 26 in the drawing denotes a nozzle moving mechanism. The nozzle moving mechanism 26 moves the nozzle 24 via the arm 25 in the arrangement direction of the treatment cups 23 and moves up and down the nozzle 24 via the arm 25. By the nozzle moving mechanism 26, the nozzle 24 moves between a position above the treatment cup 23 of one of the resist film forming modules COT and a position above the treatment cup 23 of the other resist film forming module COT, and supplies (discharges) a photoresist solution to the center of the wafer W delivered to each spin chuck 22. The supplied photoresist solution diffuses to the edge portion of the wafer W by the centrifugal force of the wafer W rotated around the vertical axis by the spin chuck 22 and forms into a resist film.

Note that the configuration in which each treatment cup 23 is provided for each one of solution treatment modules so that two solution treatment modules share one nozzle 24 is described here, but a configuration in which one solution treatment module includes one nozzle 24 and two treatment cups 23 and the nozzle 24 is shared by the two treatment cups 23 may be employed.

Though the details are omitted here, the hard mask film forming module HMCT is formed of a later-described coating treatment apparatus 40 according to this invention and configured to form a masking film at the edge portion of the wafer W, then form a hard mask film on the front surface of the wafer W, and thereafter remove the masking film to thereby form a hard mask film on the front surface of the wafer W except the edge portion.

In a thermal treatment module 27 arranged at a position opposite to the solution treatment module 21 with respect to the carry region R1 to R6, the shelf units U1 to U6 are arranged. The shelf units U1 to U6 are arranged in order from the carrier block S1 side to the interface block S4 side. Each of the shelf units U1 to U5 is configured such that heating modules 28 that perform heat treatment on the wafer W are stacked, for example, in two tiers. The heating module 28 includes a hot plate 29a that heats the wafer W and a cooling plate 29b that cools the wafer W after the heating. Accordingly, the first unit block B1 includes ten heating modules. The shelf unit U6 is composed of stacked edge exposure modules WEE1, WEE2 each of which performs edge exposure on the wafer W after resist coating.

In the carry region R1, the carrier arm A1 is provided. The carrier arm A1 is formed to be movable forward and backward in the X- and Y-directions, movable up and down in the vertical Z-direction, rotatable (in the θ-direction) around the vertical axis and configured to be movable in a length direction of the treatment block S3 and movable to a waiting section on the multi-purpose block S2 side or the interface block side to be able to deliver the wafer W among all of the modules in the unit block B1.

Note that a moving mechanism and a drive mechanism of each part of the transfer arm A1 are electrically connected to a later-described control unit 60 and controlled based on signals from the control unit 60.

The other unit blocks will be described. In the second unit block B2, two anti-reflection film forming modules BCT and two resist film forming modules COT are provided. Further, ten heating modules constituting the shelf units U1 to U5 are provided. Two edge exposure modules constituting the shelf unit U6 are provided.

The third unit block B3 has substantially the same configuration as that of the second unit block B2 but is different from the second unit block B2 in that it has protective film forming modules TCT for liquid immersion exposure in place of the anti-reflection film forming modules BCT. Further, the third unit block B3 includes rear surface cleaning modules BST in place of the resist film forming modules COT. The protective film forming module TCT has the same configuration as that of the anti-reflection film forming module BCT except that it supplies a treatment solution for forming a water repellent protective film on the wafer W. In other words, the protective film forming modules TCT include treatment cups 23 and spin chucks 22 each for treating the wafer W, and a nozzle 24 is shared by the two treatment cups 23 and the two spin chucks 22.

In the rear surface cleaning module BST, a nozzle for supplying a cleaning solution to the rear surface and a beveled portion at the edge of the wafer W to clean the rear surface of the wafer W is individually provided instead of providing the nozzle 24 for supplying the treatment solution to the front surface of the wafer W. Except the differences, the rear surface cleaning module BST has the same configuration as that of the anti-reflection film forming module BCT. Note that the rear surface cleaning module BST may be configured to clean only the rear surface side of the wafer W or only the beveled portion. Further, the shelf unit U6 in the third unit block B3 is composed of heating modules 28 in place of the edge exposure modules WEE.

The fourth unit block B4 is configured similarly to the already-described third unit block B3 and is provided with protective film forming modules TCT and rear surface cleaning modules BST. The shelf units U1 to U6 in the fourth unit block B4 are composed of heating modules 28.

The fifth unit block B5 has substantially the same configuration as that of the second unit block B2, but is different from the second unit block B2 in that it has four developing modules DEV in place of the anti-reflection film forming modules BCT and the resist film forming modules COT. The developing module DEV is configured similarly to the resist film forming module COT except that it supplies a developing solution to the wafer W in place of resist. Further, the shelf units U1 to U6 in the fifth unit block B5 are composed of heating modules 28.

The sixth unit block B6 is configured similarly to the fifth unit block B5 and is provided with four developing modules DEV. Further, the shelf units U1 to U6 in the six unit block B6 are composed of heating modules 28.

Next, returning to the multi-purpose block S2, the configuration of the shelf unit U7 provided in the multi-purpose block S2 will be described. The shelf unit U7 is composed of a plurality of modules being mounting parts stacked one on the other such that hydrophobic treatment modules ADH1, ADH2 and delivery modules CPL1 to CPL3 are provided at height positions to which the carrier arm A1 of the first unit block B1 can access.

At height positions to which the carrier arm A2 of the second unit block B2 can access, hydrophobic treatment modules ADH3, ADH4 and delivery modules CPL4 to CPL6 are provided. In the description, the delivery module described as CPL includes a cooling stage that cools the wafer W mounted thereon. The delivery module described as BU is configured to be able to house a plurality of wafers W and keep them stay therein.

The hydrophobic treatment modules ADH1 to ADH4 supply treatment gas to the wafer W to improve the hydrophobic property of the front surface of the wafer W. This suppresses peeling of each film off the wafer W during liquid immersion exposure. In particular, by the improvement in hydrophobic property at the beveled portion (edge portion) of the wafer W, even if the film at the edge portion is removed in each solution treatment module 21 and the front surface of the wafer W is exposed, the front surface has a water repellent effect so that the treatment is performed to suppress the peeling of each film off the edge portion during the liquid immersion exposure.

At height positions to which the carrier arms A3, A4 of the unit blocks B3, B4 can access, delivery modules CPL7 to CPL8, CPL9 to CPL10 are provided. Further, at height positions to which the carrier arm 13 of the carrier block S1 can access, delivery modules BU1, BU2 and CPL0 are provided. The delivery module BU1, BU2 includes five holding parts for wafers W in the vertical direction in order to collectively receive the carried wafers W from the already-described delivery arm 13. The delivery module CPL0 is used for returning the wafer W which has been subjected to developing treatment to the carrier C.

Further, at height positions to which the carrier arm A5 of the fifth unit block B5 can access, delivery modules CPL12 to CPL13 and BU3 are provided, and at height positions to which the carrier arm A6 of the sixth unit block B6 can access, delivery modules CPL14 to CPL15 and BU4 are provided.

On the interface block S4 side in the treatment block S3, a treatment shelf unit U8 is provided at a position to which the carrier arms A1 to A6 of the unit block B1 to the unit block B6 can access. The treatment shelf unit U8 includes a delivery module BU5 at a position corresponding to the third unit block B3 to the sixth unit block B6. Below the delivery module BU5, delivery modules TRS, CPL 16 to CPL 18 are provided stacked one on the other. The treatment shelf unit U8 is movable into the interface block S4.

At a position on the front surface side of the apparatus (on the lower side on the paper sheet of FIG. 1) with respect to the treatment shelf unit U8, four post-exposure cleaning modules PIR are provided stacked one on the other. Between the post-exposure cleaning modules PIR and the treatment shelf unit U8, a treatment delivery arm 31 is arranged. The treatment delivery arm 31 is formed to be movable forward and backward in the horizontal X- and Y-directions, movable up and down in the vertical Z-direction, rotatable in the θ-direction around the vertical axis and configured to deliver the wafer W between each of the modules in the treatment shelf unit U8 and the post-exposure cleaning module PIR and between each of the modules in the treatment shelf unit U8 and the solution treatment module 21.

Near the apparatus rear surface side (on the upper side on the paper sheet of FIG. 1) of the treatment shelf unit U8, a treatment delivery arm 32 is arranged. The treatment delivery arm 32 performs delivery of the wafer W between the treatment shelf unit U8 and the heating module 28 closest to the treatment delivery arm 32 in the thermal treatment module 27.

In the interface block S4, an interface arm 33 is arranged which delivers the wafer W between the delivery module BU5 in the treatment shelf unit U8, the post-exposure cleaning module PIR and the exposure apparatus S5. The interface arm 33 is formed to be movable forward and backward in the horizontal X- and Y-directions, movable up and down in the vertical Z-direction, rotatable in the θ-direction around the vertical axis.

A moving mechanism 35 of the interface arm 33 and a moving mechanism and a drive mechanism of each part of the interface arm 33 are electrically connected to the control unit 60 to deliver the wafer W based on a signal from the control unit 60. Further, a part of a guide rail 34 and the interface arm 33 are moved from interface block S4 to the outside of the interface block S4.

Figure 2:
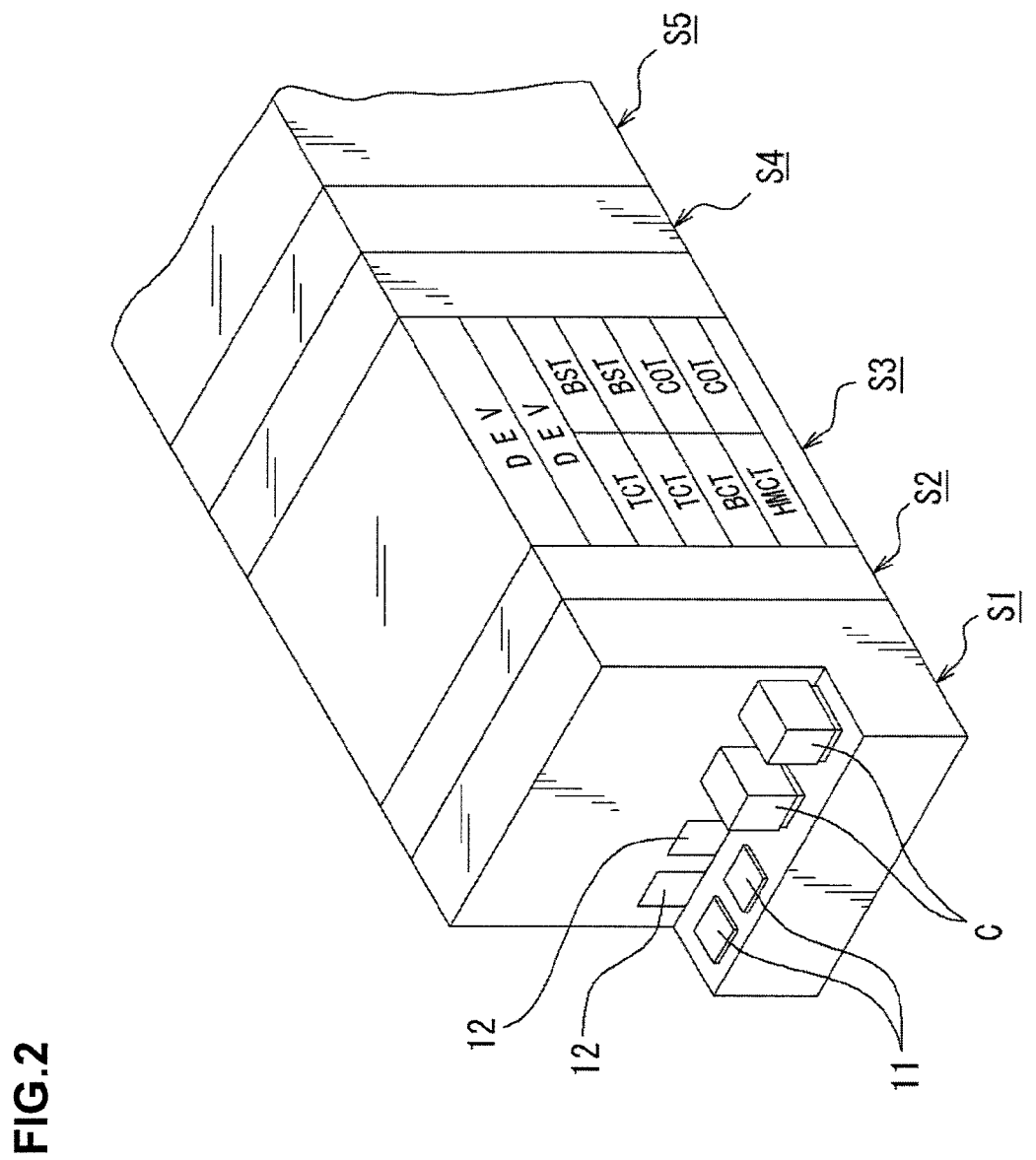
FIG. 2 is a schematic perspective view of the coating and developing treatment system in FIG. 1.
Figure 3:
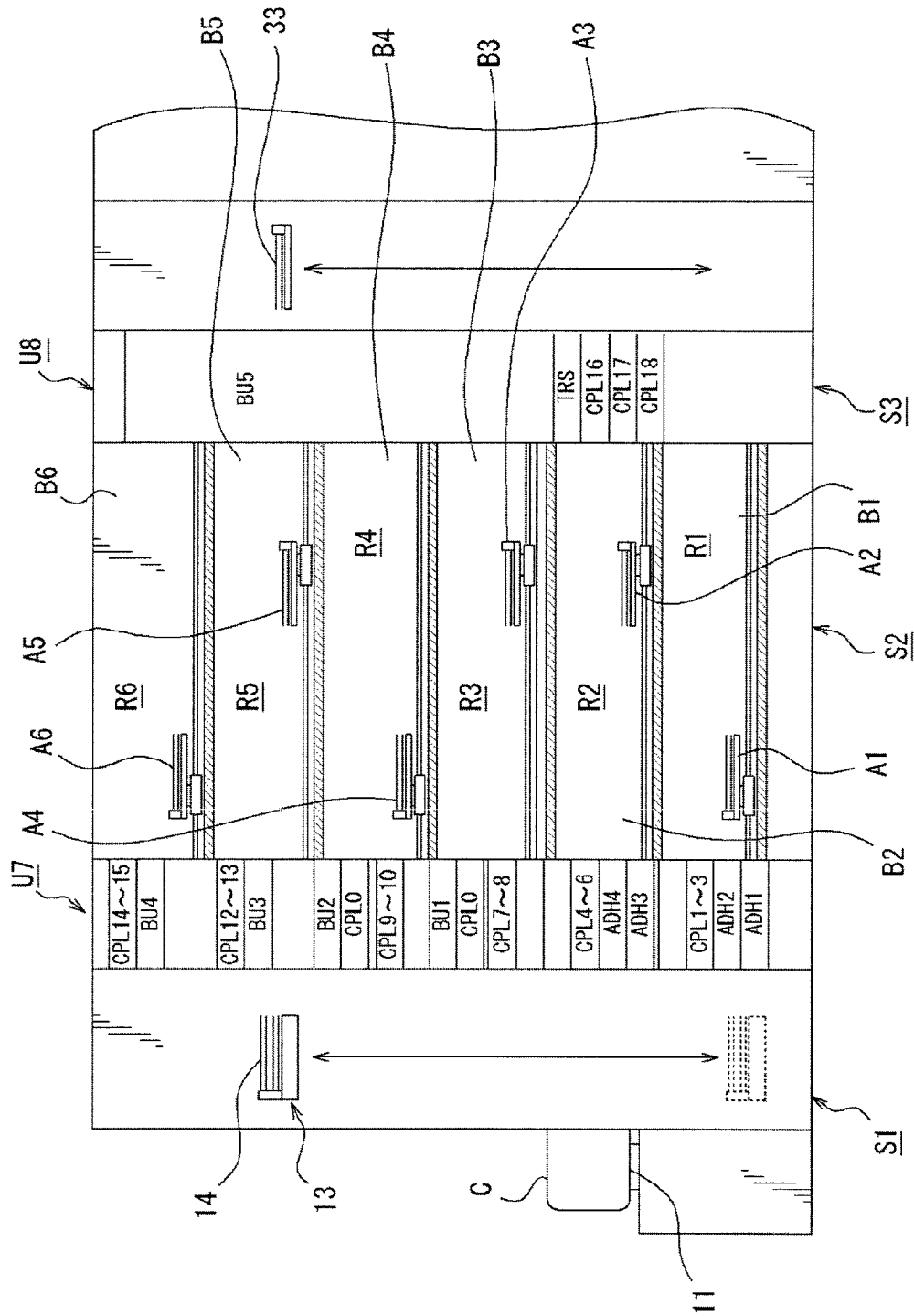
FIG. 3 is a schematic longitudinal sectional view of the coating and developing treatment system in FIG. 1.

An example of flow of the wafer W in the coating and developing treatment system configured as described above will be briefly described referring to FIG. 1 to FIG. 3. First, when the carrier C housing, for example, 25 wafers W is mounted on the mounting table 11, the lid body of the carrier C is removed together with the opening/closing part 12 and the wafers W are taken out by the delivery arm 13. Then, the wafer W is carried in the order of the delivery arm 30, the hydrophobic treatment module ADH1, ADH2, the delivery arm 30, and the delivery module CPL1. Subsequently, the carrier arm A1 carries the wafer W in the order of the hard mask film forming module HMCT, the heating module 28, the delivery module CPL2, the resist film forming module COT, the heating module 28, the edge exposure modules WEE, and the delivery module CPL3. Thereafter, the wafer W is carried in the order of the delivery arm 30 and the delivery module CPL9, and then carried by the carrier arm A4 in the order of the protective film forming module TCT, the heating module 28, the delivery module CPL 10, the rear surface cleaning module, and the delivery module BU4.

In the interface block S4, the wafer W is carried similarly to the wafer W carried to the first unit block B1 and the third unit block B3, subjected to exposure processing and post-exposure cleaning treatment, and further delivered to a height position in the delivery module BU5 corresponding to the sixth unit block B6. Thereafter, the wafer W is carried by the carrier arm A6 in the order of the delivery module CPL14, the developing module DEV, the heating module 28, the delivery module CPL15, the delivery arm 30, the delivery module CPLO, the delivery arm 13, and the carrier C.

Next, the coating treatment apparatus according to this invention will be described referring to FIG. 4 to FIG. 20.

First Embodiment

Figure 4:
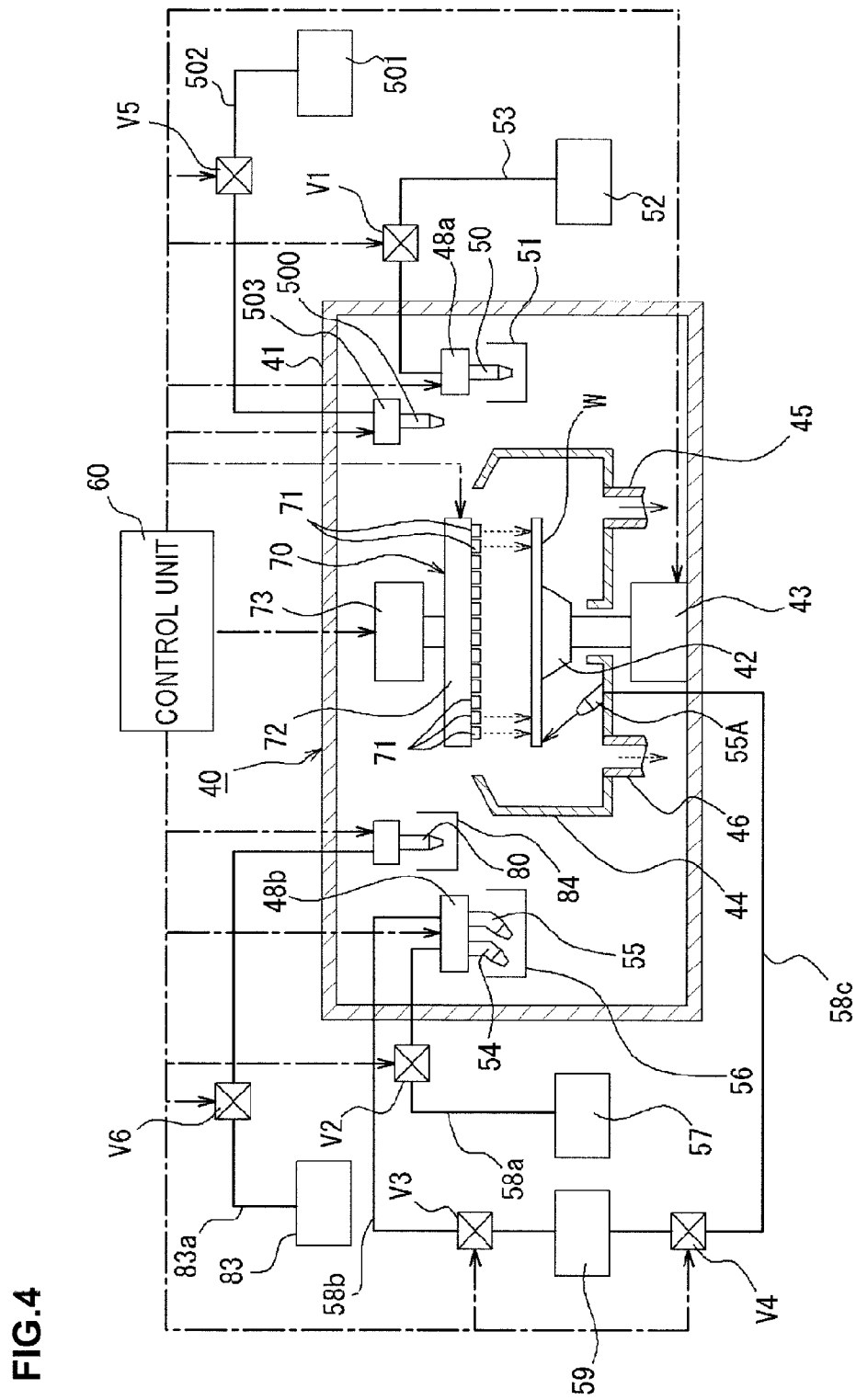
FIG. 4 is a cross-sectional view illustrating a first embodiment of the coating treatment apparatus according to this invention.

The coating treatment apparatus 40 has a treatment container 41 as illustrated in FIG. 4, and a spin chuck 42 being a substrate holding part that holds and rotates the wafer W is provided at a central portion in the treatment container 41. The spin chuck 42 has a horizontal upper surface, and the upper surface is provided with, for example, a suction port (not illustrated) for sucking the wafer W. The suction through the suction port allows the wafer W to be suction-held on the spin chuck 42.

The spin chuck 42 has a rotation mechanism 43 such as, for example, a motor. The rotation mechanism 43 can rotate at a predetermined speed based on a control signal from the later-described control unit 60. Further, the rotation mechanism 43 is provided with a raising and lowering drive source such as a cylinder, so that the spin chuck 42 can move up and down.

Around the spin chuck 42, a treatment cup 44 is provided which receives and collects liquid scattering or dropping from the wafer W. A drain pipe 45 for draining the collected liquid and an exhaust pipe 46 for exhausting the atmosphere in the treatment cup 44 are connected to the bottom surface of the treatment cup 44.

Figure 5:
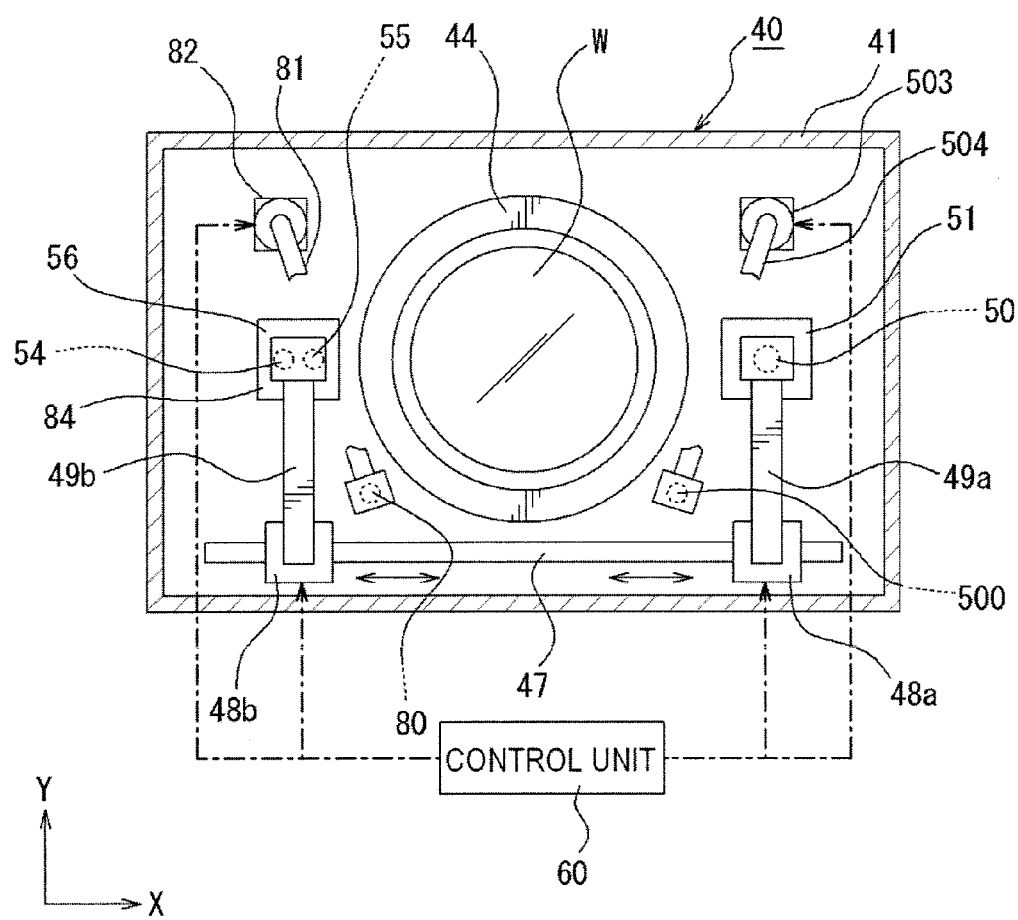
FIG. 5 is a plan view illustrating the first embodiment of the coating treatment apparatus according to this invention.

As illustrated in FIG. 5, on a Y-direction negative direction (lower direction in FIG. 5) side of the treatment cup 44, a guide rail 47 is formed which extends along the X-direction (a right-to-left direction in FIG. 5). The guide rail 47 is formed, for example, from the outside on an X-direction negative direction (left direction in FIG. 5) side of the treatment cup 44 to the outside on an X-direction positive direction (right direction in FIG. 5) side. To the guide rail 47, for example, a first nozzle moving mechanism 48a and a second nozzle moving mechanism 48b are attached to be freely movable. The first nozzle moving mechanism 48a and the second nozzle moving mechanism 48b are electrically connected to the control unit 60, and is formed to be freely movable along the guide rail 47 based on the control signal from the control unit 60.

To the first nozzle moving mechanism 48a, a first arm 49a is attached in the Y-direction, and on the first arm 49a, a hard mask solution supply nozzle 50 (hereinafter, referred to as a hard mask nozzle 50) that supplies a hard mask solution is supported as illustrated in FIG. 4 and FIG. 5. The first arm 49a is configured to be freely movable on the guide rail 47 by the first nozzle moving mechanism 48a. This allows the hard mask nozzle 50 to move from a waiting section 51 provided at the outside on the X-direction positive direction side of the treatment cup 44 to above a central portion of the wafer W in the treatment cup 44 and further move in a radial direction of the wafer W above the front surface of the wafer W. Further, the first arm 49a can freely move up and down by means of the first nozzle moving mechanism 48a to be able to adjust the height of the hard mask nozzle 50.

To the hard mask nozzle 50, a hard mask solution supply pipe 53 connected to a hard mask solution supply source 52 is connected as illustrated in FIG. 4. The hard mask solution supply source 52 is composed of a bottle that stores the hard mask solution, and configured to supply (pressure-feed) a hard mask solution to the hard mask nozzle 50 side by pressurization of gas (nitrogen gas) supplied from a gas supply source, for example, a $N_2$ supply source (not illustrated). Further, the hard mask solution supply pipe 53 is provided with a first opening/closing valve V1 having a flow rate adjusting function. Note that as the hard mask solution, a metal hard mask solution containing an organic substance and an inorganic substance is used. The metal hard mask solution contains metal such as titanium, aluminum, tungsten or the like.

Figure 5A:
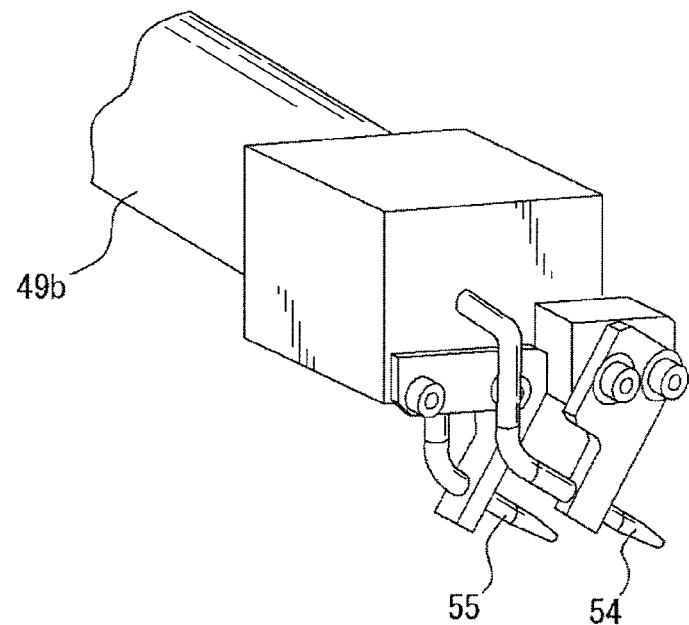
FIG. 5A is a perspective view illustrating examples of a masking solution supply nozzle and a removing solution supply nozzle in this invention.

To the second nozzle moving mechanism 48b, a second arm 49b is attached in the Y-direction, and on the second arm 49b, a masking solution supply nozzle 54 (hereinafter, referred to as a masking nozzle 54) that supplies a masking solution, for example, a negative photoresist solution and a masking film removing solution supply nozzle 55 (hereinafter, a masking film removing nozzle 55) that supplies a removing solution, for example, a developing solution, which dissolves a negative photoresist film being a masking film, are provided in parallel in the X-direction. The second arm 49b is freely movable on the guide rail 47 by the second nozzle moving mechanism 48b and can move the masking nozzle 54 and the masking film removing nozzle 55 from a waiting section 56 provided at the outside on the X-direction negative direction side of the treatment cup 44 to above the edge portion of the wafer W in the treatment cup 44 as illustrated in FIG. 5. Further, by the second nozzle moving mechanism 48b, the second arm 49b is freely movable up and down to be able to adjust the heights of the masking nozzle 54 and the masking film removing nozzle 55. Note that the masking nozzle 54 and the masking film removing nozzle 55 are composed of inclined nozzles inclined from the center side of the wafer W toward the outside respectively (see FIG. 4 and FIG. 5A).

To the masking nozzle 54, a masking solution supply pipe 58a connected to a masking solution supply source 57 is connected as illustrated in FIG. 4. The masking solution supply pipe 58a is provided with a second opening/closing valve V2 having a flow rate adjusting function. On the other hand, to the masking film removing nozzle 55, a removing solution supply pipe 58b connected to a removing solution supply source 59 is connected as illustrated in FIG. 4. The removing solution supply pipe 58b is provided with a third opening/closing valve V3 having a flow rate adjusting function.

At the bottom part of the treatment cup 44, a rear surface masking film removing solution supply nozzle 55A (hereinafter, referred to as a rear surface masking film removing nozzle 55A) is arranged which supplies (discharges) a removing solution (developing solution) toward the edge portion on the rear surface side of the wafer W. To the rear surface masking film removing nozzle 55A, a removing solution supply pipe 58c connected to the removing solution supply source 59 is connected as illustrated in FIG. 4. The removing solution supply pipe 58c is provided with a fourth opening/closing valve V4 having a flow rate adjusting function.

In the coating treatment apparatus 40, a cleaning nozzle 500 is provided which cleans the wafer W after the masking film is removed. The cleaning nozzle 500 is supported by an arm 504, and configured to be movable in the horizontal X- and Y-directions from the outside of the wafer W to the inside of the wafer W and in the vertical Z-direction by a cleaning nozzle moving mechanism 503 to which the arm 504 is attached.

To the cleaning nozzle 500, a cleaning solution supply pipe 502 connected to a supply source 501 of a cleaning solution, for example, deionized water (DIW) is connected as illustrated in FIG. 4. Further, the cleaning solution supply pipe 502 is provided with a fifth opening/closing valve V5 having a flow rate adjusting function.

The coating treatment apparatus 40 in the first embodiment includes a hard mask film removing solution supply part 80 (hereinafter, referred to as a hard mask film removing nozzle 80) that supplies a hard mask film removing solution, for example, a mixed solution of PGME and PGMEA (mixed solution of propylene glycol monomethyl ether-propylene glycol monomethyl ether acetate) dissolving the hard mask film, for example, the metal hard mask film containing an organic substance and an inorganic substance. As illustrated in FIG. 5, the hard mask film removing nozzle 80 is supported by an arm 81. The hard mask film removing nozzle 80 can be moved by a fourth nozzle moving mechanism 82 to which the arm 81 is attached, from a waiting section 84 provided at the outside of the treatment cup 44 to above the edge portion of the wafer W in the treatment cup 44. Further, the arm 81 can be moved up and down by the fourth nozzle moving mechanism 82 to be able to adjust the height of the hard mask film removing nozzle 80.

To the hard mask film removing nozzle 80, a hard mask film removing solution supply pipe 83a connected to a hard mask film removing solution supply source 83 is connected as illustrated in FIG. 4. The hard mask film removing solution supply pipe 83a is provided with a sixth opening/closing valve V6 having a flow rate adjusting function.

The rotation mechanism 43, the first nozzle moving mechanism 48a, the second nozzle moving mechanism 48b, the fourth nozzle moving mechanism 82, the cleaning nozzle moving mechanism 503, and the first opening/closing valve V1 to the sixth opening/closing valve V6 are electrically connected to the control unit 60 and driven and controlled based on control signals from the control unit 60 respectively. The control unit 60 is composed of a computer including, for example, a CPU and a memory, and can realize treatments such as masking film formation, hard mask film formation, removal of the hard mask film formed at the edge portion of the wafer W and removal of the masking film and so on in the coating treatment apparatus 40 by executing programs stored, for example, in the memory. Note that various kinds of programs used for realizing the treatments such as masking film formation, hard mask film formation, removal of the hard mask film formed at the edge portion of the wafer W and removal of masking film and so on in the coating treatment apparatus 40 are the ones which have been stored, for example, in a computer readable storage medium such as a hard disk (HD), a flexible disk (FD), a compact disk (CD), a magneto-optical disk (MD), a memory card or the like and installed from the storage medium to the control unit 60.

The masking nozzle 54 and the masking film removing nozzle 55 are supported by the same second arm 49b and attached to the second nozzle moving mechanism 48b in the above embodiment, but the masking nozzle 54 and the masking film removing nozzle 55 may be supported by separate arms and the masking film removing nozzle 55 may be attached to a not-illustrated third nozzle moving mechanism so that the movements and supply timings of the masking nozzle 54 and the masking film removing nozzle 55 are controlled by controlling the movements of the arms. Further, the hard mask nozzle 50 and the masking nozzle 54 and the masking film removing nozzle 55 are supported by the separate first arm 49a and second arm 49b in the above embodiment, but the hard mask nozzle 50 and the masking nozzle 54 and the masking film removing nozzle 55 may be supported by the same arm so that the movements and supply timings of the hard mask nozzle 50 and the masking nozzle 54 and the masking film removing nozzle 55 are controlled by controlling the movement of the arm. Furthermore, the masking film removing nozzle 55 and the cleaning nozzle 500 are separately formed in the above embodiment, but the masking film removing nozzle 55 and the cleaning nozzle 500 may be supported by the same arm so that the movements and supply timings of the masking film removing nozzle 55 and the cleaning nozzle 500 are controlled by controlling the movement of the arm.

Note that the hard mask film removing nozzle 80 is supported by the independent arm 81 in the above embodiment but may be supported by the first arm 49a or the second arm 49b so that the movements and supply timings of the masking nozzle 54 and the masking film removing nozzle 55 or the hard mask nozzle 50 are controlled by controlling the movement of the first arm 49a or the second arm 49b.

The coating treatment apparatus 40 includes a heating body, for example, an LED illumination heating body 70 that is arranged above the opening of the treatment cup 44, and a heating body moving mechanism 73 that moves the LED illumination heating body 70 to approach and separate to/from the front surface of the wafer W held by the spin chuck 42, and the LED illumination heating body 70 and the heating body moving mechanism 73 are controlled by the control unit 60.

Though detailed description will be omitted, the LED illumination heating body 70 includes a plurality of LEDs 71 that are arranged on the same plane and a control power supply 72 that controls power feeding to the LEDs 71. In this case, the LEDs 71 only need to output a wavelength capable of heat-treating a masking film M and a hard mask film HM, for example, a wavelength of 800 nm to 900 nm.

Figure 9:
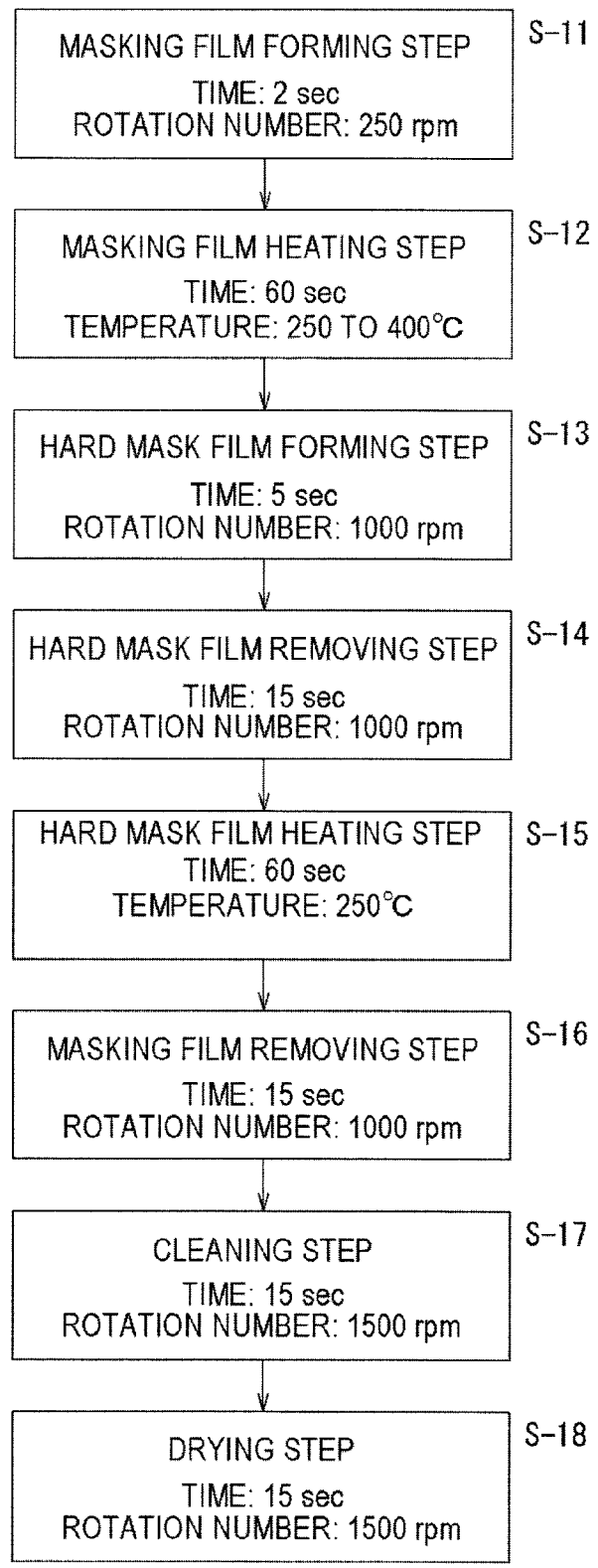
FIG. 9 is a flowchart illustrating the coating treatment method of the first embodiment.

Next, a treatment process performed in the coating treatment apparatus 40 in the first embodiment configured as described above will be described referring to FIG. 6 to FIG. 9. FIG. 9 is a flowchart illustrating main steps of the treatment process in the coating treatment apparatus 40.

(Step S-11) First, the wafer W carried by the carrier arm A1 is held by the spin chuck 42. The masking nozzle 54 is moved to above the edge portion of the wafer W. In this state, while the spin chuck 42 is being rotated, for example, at a rotation number of 250 rpm, the masking nozzle 54 discharges (supplies) the masking solution, for example, a negative photoresist solution PR to the edge portion of the wafer W, for example, for two seconds. The negative photoresist solution PR diffuses to the edge portion of the wafer W by the centrifugal force to form the masking film M at the edge portion of the front surface of the wafer W {masking film forming step: see FIG. 6(a), (a1)}.

(Step S-12) Then, the LED illumination heating body 70 is moved to above the front surface of the wafer W, in which state the rotation of the spin chuck 42 is stopped and heat energy generated by converting light radiated from the LEDs 71 is used to perform heat treatment by heating the masking film M formed at the edge portion of the front surface of the wafer W, for example, at 250 to 400° C. for 60 seconds {masking film heating step: see FIG. 6(b), (b1)}. By heating the masking film M as described above, the masking film M can be made insoluble in the hard mask solution and the hard mask film removing solution (mixed solution of PGME and PGMEA). Note that even when the masking film M is heated, the masking film M is soluble in the masking film removing solution, for example, TMAH (tetramethylammonium hydroxide solution) being the developing solution when the masking film M is formed of the photoresist (irrespective of positive or negative).

(Step S-13) After the masking film M is heat-treated, the hard mask nozzle 50 is moved to above the central portion of the wafer W. In this state, while the spin chuck 42 is being rotated, for example, at a rotation number of 1000 rpm, the hard mask nozzle 50 discharges (supplies) a hard mask solution H to the central portion of the wafer W, for example, for five seconds. Thus, the hard mask solution H diffuses over the front surface of the wafer W to form the hard mask film HM on the front surface of the wafer W {hard mask film forming step: see FIG. 6(c), (c1)}.

(Step S-14) After the hard mask film HM is formed on the front surface of the wafer W, the hard mask film removing nozzle 80 is moved to above the edge portion of the wafer W. In this state, while the spin chuck 42 is being rotated, for example, at a rotation number of 1000 rpm, the hard mask film removing nozzle 80 discharges (supplies) the hard mask film removing solution (mixed solution of PGME and PGME) dissolving the hard mask film (metal hard mask film containing an organic substance and an inorganic substance) to the edge portion of the wafer W, for example, for 15 seconds. The hard mask film removing solution dissolves and removes the hard mask film HM formed at the edge portion of the front surface of the wafer W {hard mask film removing step: see FIG. 6(d), FIG. 7}.

(Step S-15) Then, the LED illumination heating body 70 is moved to above the front surface of the wafer W, in which state the rotation of the spin chuck 42 is stropped and heat energy generated by converting light radiated from the LEDs 71 is used to perform heat treatment on the hard mask film HM formed on the front surface of the wafer W, for example, at 250° C. for 60 seconds {hard mask film heating step: see FIG. 6(e)}. By heating the hard mask film HM as described above, the hard mask film HM is cross-linked and thus made insoluble in the masking film removing solution.

(Step S16) After the hard mask film HM is heat-treated, the masking film removing nozzle 55 is moved to above the edge portion of the wafer W. In this state, while the spin chuck 42 is being rotated, for example, at a rotation number of 1000 rpm, the masking film removing nozzle 55 discharges (supplies) the masking film removing solution, for example, TMAH dissolving the masking film (negative photoresist film) to the edge portion of the wafer W, for example, for 15 seconds. TMAH diffuses to the edge portion of the wafer W by the centrifugal force to dissolve and remove the masking film M formed at the edge portion of the front surface of the wafer W {masking film removing step: see FIG. 6(f), 6(f1), (g), FIG. 8}.

After the masking film M formed at the edge portion of the wafer W is removed as described above, the cleaning nozzle 500 is moved to above the edge portion of the wafer W. In this state, while the spin chuck 42 is being rotated, for example, at a rotation number of 1500 rpm, the cleaning nozzle 500 discharges (supplies) the cleaning solution, for example, the deionized water (DIW) to the edge portion of the wafer W, for example, for 15 seconds to remove the masking film remaining at the edge portion of the wafer W {Step S-17: cleaning step}. After the cleaning step, the spin chuck 42 is rotated, for example, at a rotation number of 1500 rpm, for example, for 15 seconds to dry the cleaning solution by spinning it off, with which the treatment ends {Step S-18: drying step}.

A series of Steps S-11 to S-18 described above are executed by a control computer reading control programs stored in the memory of the control computer in the control unit 60 and outputting control signals for operating the already-described mechanisms based on read commands.

According to the first embodiment configured as described above, the hard mask film removing solution (mixed solution of PGME and PGMEA) dissolving the hard mask film (metal hard mask film containing an organic substance and an inorganic substance) is supplied to the hard mask film HM formed at the edge portion of the wafer W to remove the hard mask film HM at the edge portion of the wafer W, and then the masking film removing solution dissolving the masking film is supplied to the masking film M to remove the masking film M at the edge portion of the wafer W, thereby removing the hard mask film HM at the edge portion of the wafer W at two stages. Accordingly, the hard mask film adhering to the edge portion of the wafer W can be surely removed, thus facilitating the application of the hard mask.

Though the hard mask film HM is cross-linked and made insoluble in the masking film removing solution by heating the hard mask film HM in the first embodiment, the hard mask film heating step is unnecessary if the masking film removing solution is originally a treatment solution having a property of not dissolving the hard mask film HM. However, the hard mask film heating step may be executed even if the masking film removing solution does not dissolve the hard mask film HM.

Second Embodiment

Figure 10:
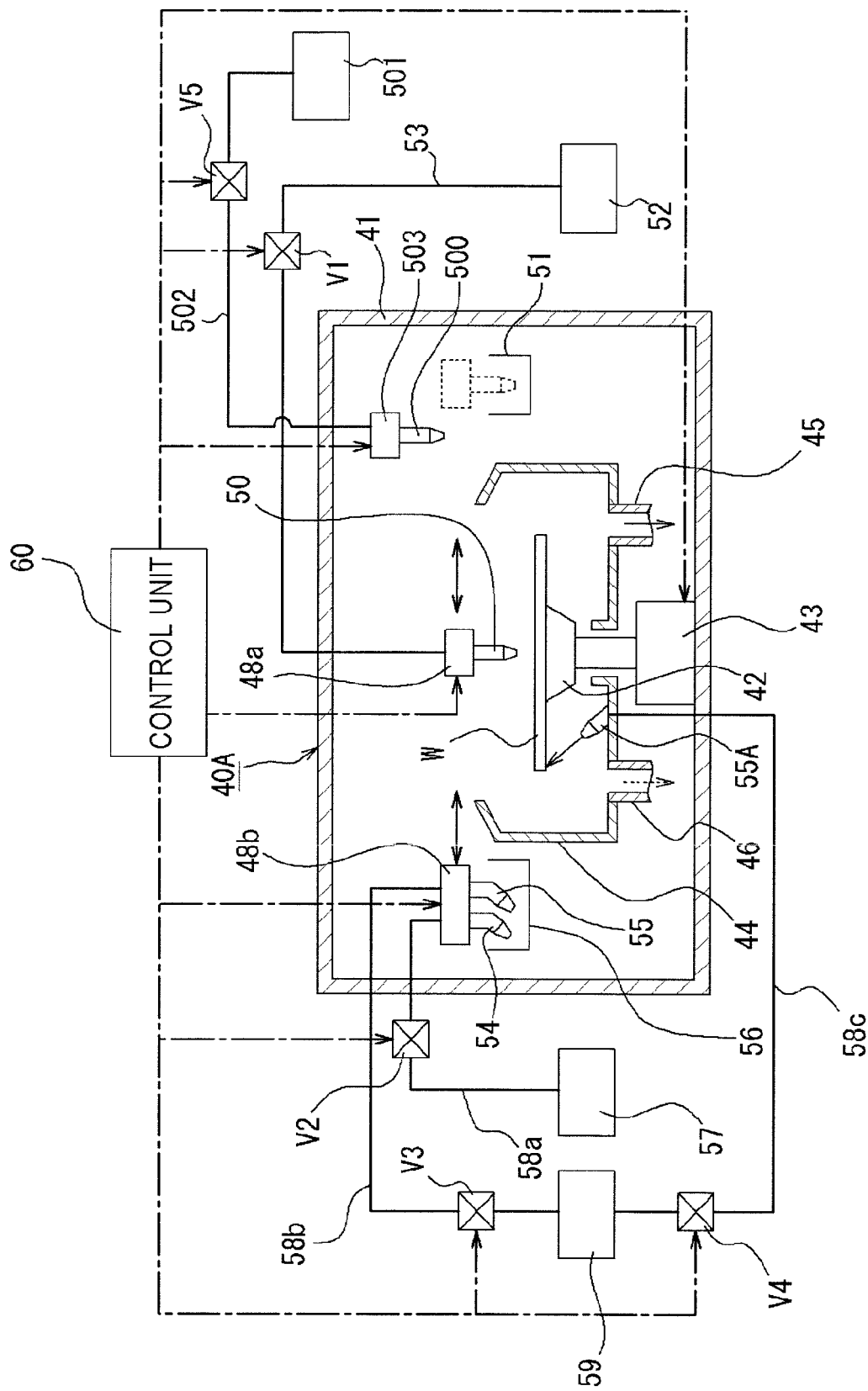
FIG. 10 is a cross-sectional view illustrating a second embodiment of a coating and developing apparatus according to this invention.
Figure 11:
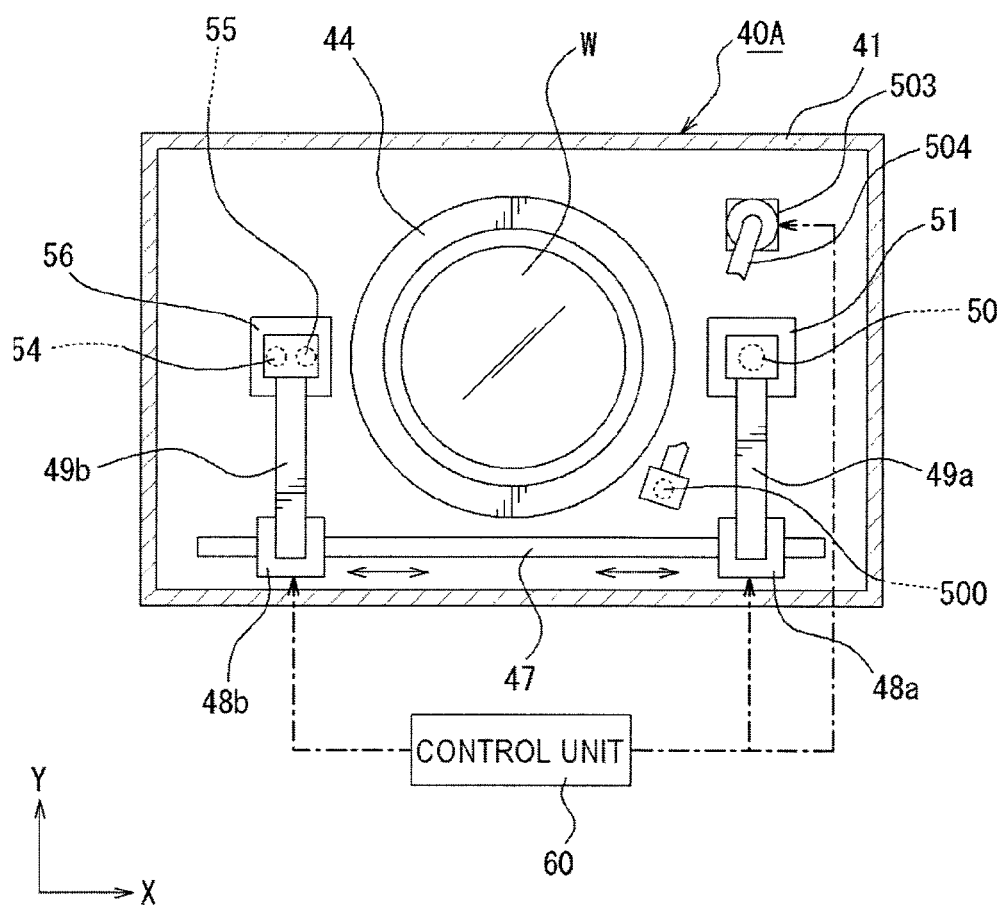
FIG. 11 is a plan view of the coating treatment apparatus.

FIG. 10 is a cross-sectional view illustrating a second embodiment of the coating treatment apparatus according to this invention, and FIG. 11 is a plan view thereof. A coating treatment apparatus 40A of the second embodiment has a structure made by omitting the LED illumination heating body 70, the hard mask film removing nozzle 80 and so on from the coating treatment apparatus 40 of the first embodiment. Hereinafter, the coating treatment apparatus 40A of the second embodiment will be briefly described with the same numerals and symbols given to the same parts as those in the first embodiment.

In the coating treatment apparatus 40A of the second embodiment, a spin chuck 42 being a substrate holding part that holds and rotates the wafer W is provided a central portion in a treatment container 41, and a treatment cup 44 which receives and collects liquid scattering or dropping from the wafer W is provided around the spin chuck 42 as illustrated in FIG. 10.

As illustrated in FIG. 11, on a Y-direction negative direction (lower direction in FIG. 11) side of the treatment cup 44, a guide rail 47 is formed which extends along an X-direction (a right-to-left direction in FIG. 11). To the guide rail 47, a first nozzle moving mechanism 48a and a second nozzle moving mechanism 48b are attached to be freely movable.

To the first nozzle moving mechanism 48a, a first arm 49a is attached in a Y-direction, and on the first arm 49a, a hard mask nozzle 50 is supported. This allows the hard mask nozzle 50 to move from a waiting section 51 provided at the outside on an X-direction positive direction side of the treatment cup 44 to above a central portion of the wafer W in the treatment cup 44 and further move in a radial direction of the wafer W above the front surface of the wafer W. Further, the first arm 49a can freely move up and down by means of the first nozzle moving mechanism 48a to be able to adjust the height of the hard mask nozzle 50.

To the hard mask nozzle 50, a hard mask solution supply pipe 53 connected to a hard mask solution supply source 52 is connected as illustrated in FIG. 10. The hard mask solution supply pipe 53 is provided with a first opening/closing valve V1 having a flow rate adjusting function.

To the second nozzle moving mechanism 48b, a second arm 49b is attached in the Y-direction, and on the second arm 49b, a masking nozzle 54 that supplies a masking solution, for example, a negative photoresist solution and a masking film removing nozzle 55 that supplies a removing solution, for example, a developing solution, which dissolves the negative photoresist film being the masking film, are provided in parallel in the X-direction. The second arm 49b is freely movable on the guide rail 47 by the second nozzle moving mechanism 48b and can move the masking nozzle 54 and the masking film removing nozzle 55 from a waiting section 56 provided at the outside on an X-direction negative direction side of the treatment cup 44 to above the edge portion of the wafer W in the treatment cup 44 as illustrated in FIG. 11. Further, by the second nozzle moving mechanism 48b, the second arm 49b is freely movable up and down to be able to adjust the heights of the masking nozzle 54 and the masking film removing nozzle 55. Note that the masking nozzle 54 and the masking film removing nozzle 55 are composed of inclined nozzles inclined from the center side of the wafer W toward the outside respectively (See FIG. 10 and FIG. 5A).

To the masking nozzle 54, a masking solution supply pipe 58a connected to a masking solution supply source 57 is connected as illustrated in FIG. 10. The masking solution supply pipe 58a is provided with a second opening/closing valve V2 having a flow rate adjusting function. On the other hand, to the masking film removing nozzle 55, a removing solution supply pipe 58b connected to a removing solution supply source 59 is connected as illustrated in FIG. 10. The removing solution supply pipe 58b is provided with a third opening/closing valve V3 having a flow rate adjusting function.

At the bottom part of the treatment cup 44, a rear surface masking film removing nozzle 55A is arranged which supplies (discharges) a removing solution (developing solution) toward the edge portion on the rear surface side of the wafer W. To the rear surface masking film removing nozzle 55A, a removing solution supply pipe 58c connected to the removing solution supply source 59 is connected as illustrated in FIG. 11. The removing solution supply pipe 58c is provided with a fourth opening/closing valve V4 having a flow rate adjusting function.

In the coating treatment apparatus 40A, a cleaning nozzle 500 is provided which cleans the wafer W after the masking film is removed. In this case, the cleaning nozzle 500 is supported by an arm 504, and configured to be movable in the horizontal X- and Y-directions from the outside of the wafer W to the inside of the wafer W and in the vertical Z-direction by a cleaning nozzle moving mechanism 503 to which the arm 504 is attached.

To the cleaning nozzle 500, a cleaning solution supply pipe 502 connected to a supply source 501 of a cleaning solution, for example, deionized water (DIW) is connected as illustrated in FIG. 10. Further, the cleaning solution supply pipe 502 is provided with a fifth opening/closing valve V5 having a flow rate adjusting function.

The rotation mechanism 43, the first nozzle moving mechanism 48a, the second nozzle moving mechanism 48b, the cleaning nozzle moving mechanism 503, and the first opening/closing valve V1 to the fifth opening/closing valve V5 are electrically connected to a control unit 60 and driven and controlled based on control signals from the control unit 60 respectively. The control unit 60 is composed of a computer including, for example, a CPU and a memory, and can realize treatments such as masking film formation, hard mask film formation, and removal of the masking film and so on in the coating treatment apparatus 40A by executing programs stored, for example, in the memory. Note that various kinds of programs used for realizing the treatments such as masking film formation, hard mask film formation, and removal of the masking film and so on in the coating treatment apparatus 40A are the ones which have been stored, for example, in a computer readable storage medium such as a hard disk (HD), a flexible disk (FD), a compact disk (CD), a magneto-optical disk (MD), a memory card or the like and installed from the storage medium to the control unit 60.

Note that since the other parts in the second embodiment are the same as those in the first embodiment, the same parts are given the same numerals and symbols, and description thereof will be omitted.

Figure 12:
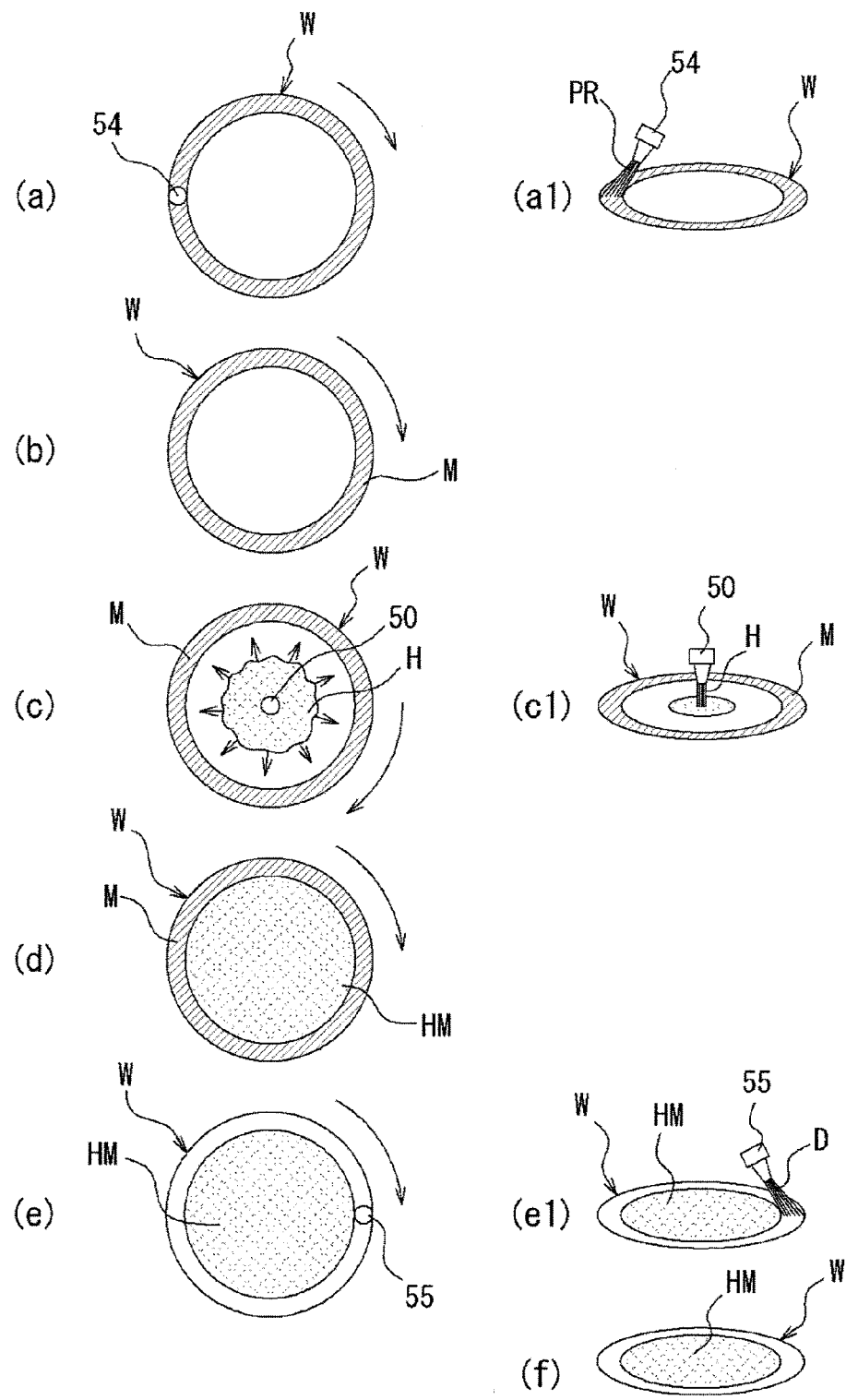
FIG. 12 illustrates schematic plan views and schematic perspective views illustrating an example of a treatment procedure of a coating treatment method of the second embodiment.
Figure 18:
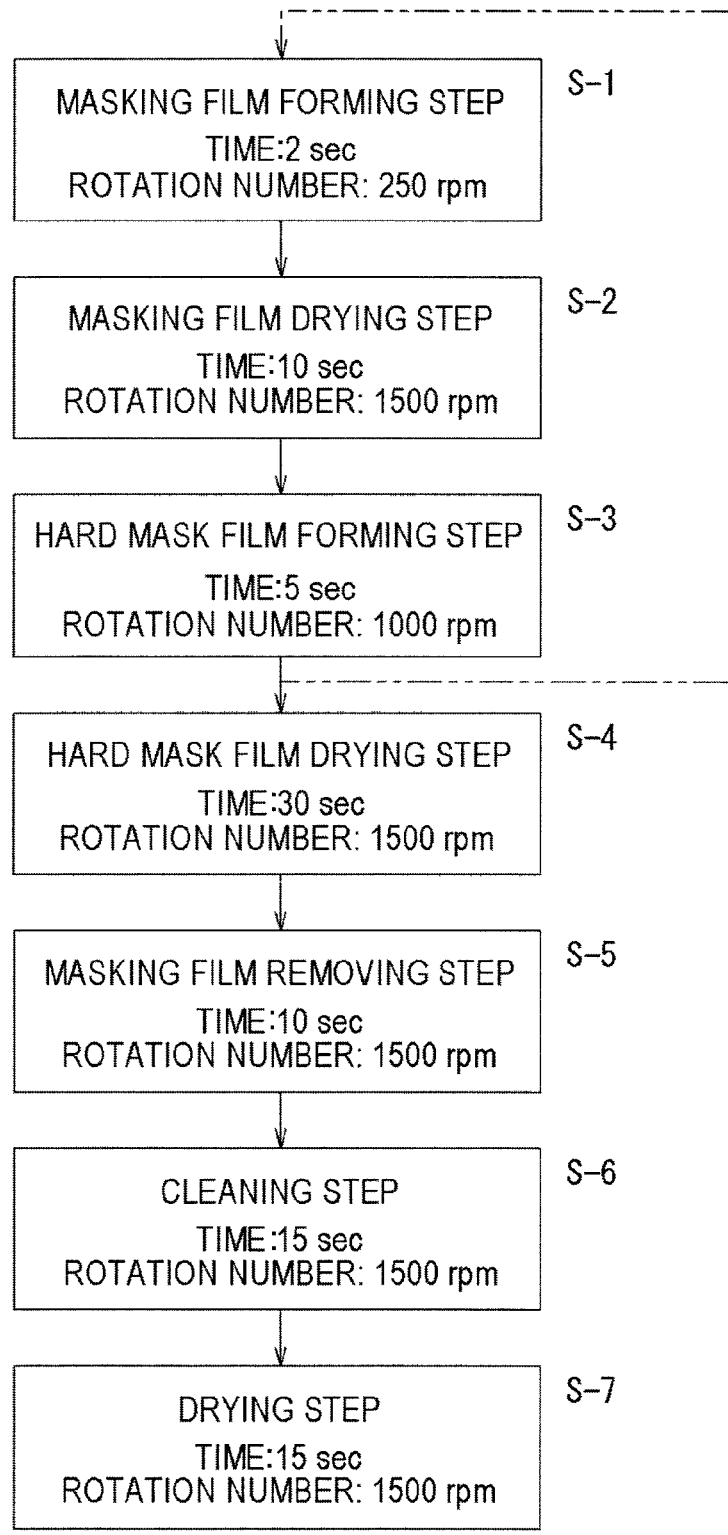
FIG. 18 is a flowchart illustrating the coating treatment method of the second embodiment according to this invention.

Next, a treatment process performed in the coating treatment apparatus 40A configured as described above will be described. FIG. 12 is a schematic plan view and a schematic perspective view illustrating one example of the treatment procedure in the coating treatment apparatus 40A. FIG. 18 is a flowchart illustrating main steps of the treatment process in the coating treatment apparatus 40A.

Figure 5B:
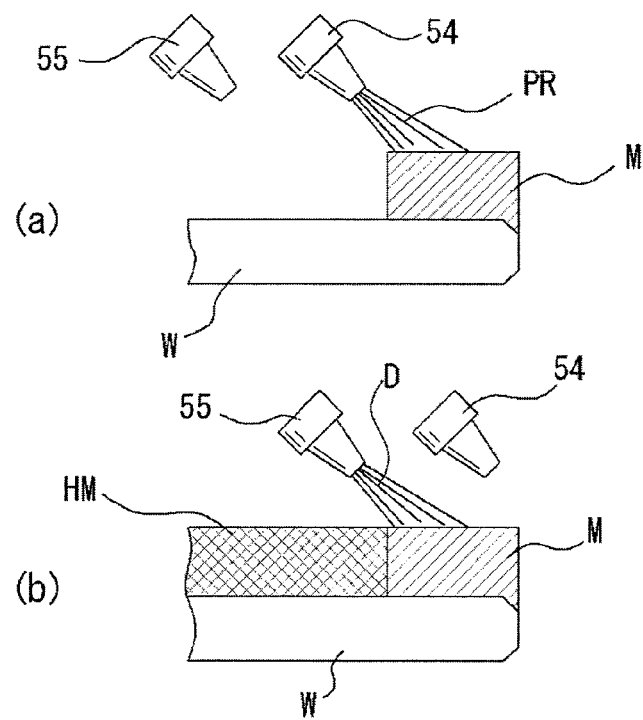
FIG. 5B is a schematic side view illustrating use states of the masking solution supply nozzle and the removing solution supply nozzle.
Figure 6:
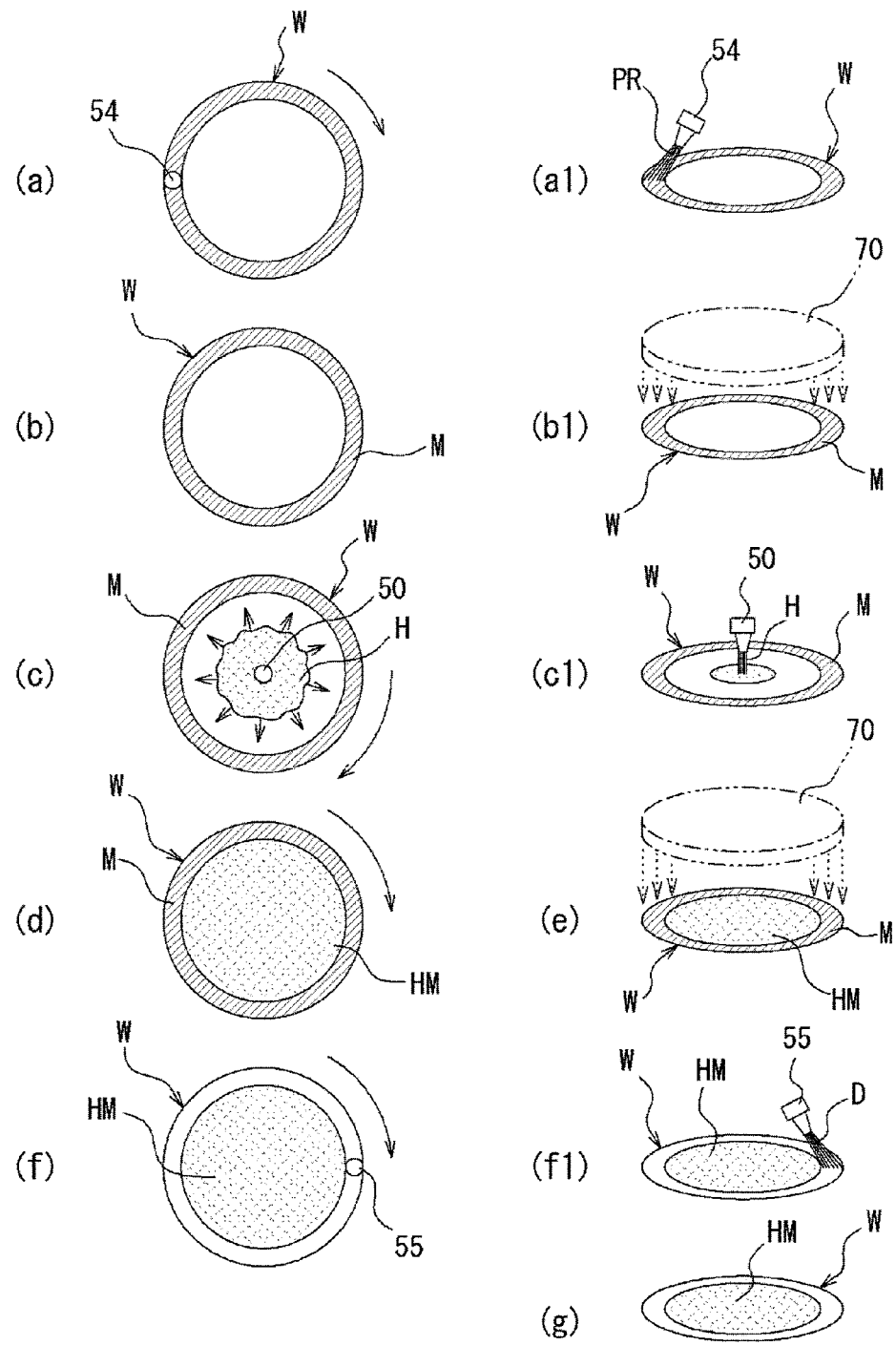
FIG. 6 illustrates schematic plan views and schematic perspective views illustrating an example of a treatment procedure of a coating treatment method of the first embodiment.
Figure 7:
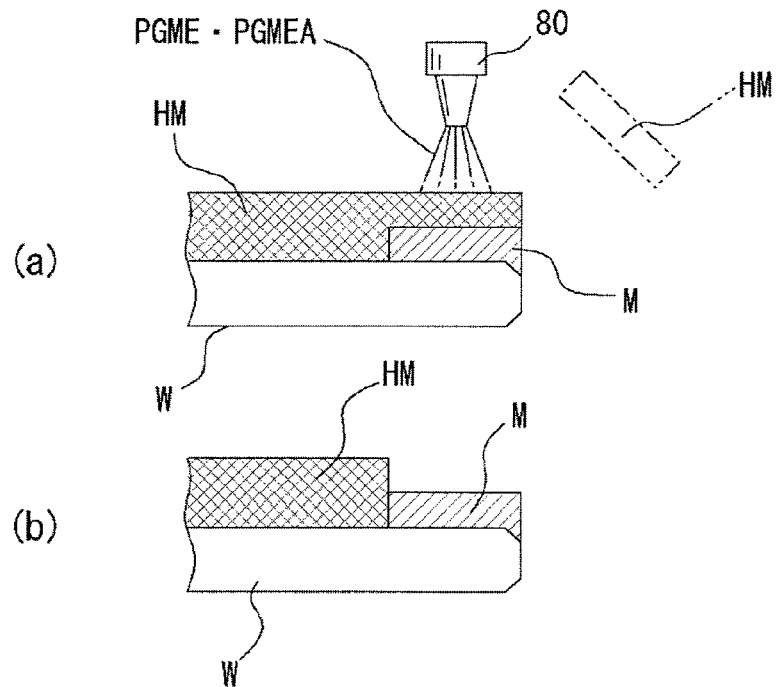
FIG. 7 illustrates schematic cross-sectional views illustrating a removing step of a hard mask film in this invention.
Figure 8:
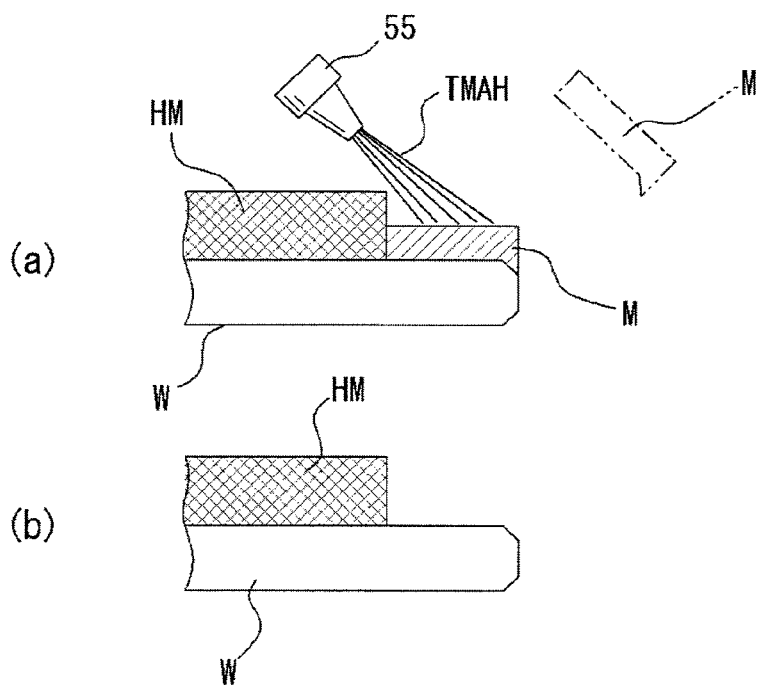
FIG. 8 illustrates schematic cross-sectional views illustrating a removing step of a masking film in this invention.

(Step S-1) First, the wafer W carried by the carrier arm A1 is held by the spin chuck 42. The masking nozzle 54 is moved to above the edge portion of the wafer W. In this state, while the spin chuck 42 is being rotated, for example, at a rotation number of 250 rpm, the masking nozzle 54 discharges (supplies) the masking solution, for example, a negative photoresist solution PR to the edge portion of the wafer W, for example, for two seconds. Thus, the negative photoresist solution PR diffuses to the edge portion of the wafer W by the centrifugal force to form a masking film M at the edge portion of the front surface of the wafer W {masking film forming step: see FIG. 5B(a), FIG. 12(a), (a1)}.

(Step S-2) Then, the spin chuck 42 is rotated, for example, at a rotation number of 1500 rpm, for example, for 10 seconds to dry the masking film M formed at the edge portion of the front surface of the wafer W {masking film drying step: see FIG. 12(b)}.

(Step S-3) After the masking film M is dried, the hard mask nozzle 50 is moved to above the central portion of the wafer W. In this state, while the spin chuck 42 is being rotated, for example, at a rotation number of 1000 rpm, the hard mask nozzle 50 discharges (supplies) a hard mask solution H to the central portion of the wafer W, for example, for five seconds. The hard mask solution H diffuses over the front surface of the wafer W to form a hard mask film HM on the front surface of the wafer W {hard mask film forming step: see FIG. 12(c), (c1)}.

(Step S-4) Then, the spin chuck 42 is rotated, for example, at a rotation number of 1500 rpm, for example, for 30 seconds to dry the hard mask film HM formed on the front surface of the wafer W {hard mask film drying step: see FIG. 12(d)}.

(Step S-5) After the hard mask film HM is dried, the masking film removing nozzle 55 is moved to above the edge portion of the wafer W. In this state, while the spin chuck 42 is being rotated, for example, at a rotation number of 1500 rpm, the masking film removing nozzle 55 discharges (supplies) a removing solution, for example, a developing solution D dissolving the masking film (negative photoresist film) to the edge portion of the wafer W, for example, for 10 seconds. Thus, the developing solution D diffuses to the edge portion of the wafer W by the centrifugal force to dissolve and remove the masking film M formed at the edge portion of the front surface of the wafer W {masking film removing step: see FIG. 5B(b), FIG. 12(e), (e1), (f) and FIG. 14}.

After the masking film M formed at the edge portion of the wafer W is removed as described above, the cleaning nozzle 500 is moved to above the edge portion of the wafer W. In this state, while the spin chuck 42 is being rotated, for example, at a rotation number of 1500 rpm, the cleaning nozzle 500 discharges (supplies) the cleaning solution, for example, the deionized water (DIW) to the edge portion of the wafer W, for example, for 15 seconds to remove the masking film remaining at the edge portion of the wafer W {Step S-6: cleaning step}. After the cleaning step, the spin chuck 42 is rotated, for example, at a rotation number of 1500 rpm, for example, for 15 seconds to dry the cleaning solution by spinning it off, with which the treatment ends {Step S-7: drying step}.

A series of Steps S-1 to S-7 described above are executed by a control computer reading control programs stored in the memory of the control computer in the control unit 60 and outputting control signals for operating the already-described mechanisms based on read commands.

The case where the masking film removing nozzle 55 discharges (supplies) the removing solution, for example, the developing solution D to the edge portion of the wafer W to remove the masking film M has been described in the embodiment. However, as illustrated in FIG. 13(g), (g1), in the state that the masking film removing nozzle 55 is moved to above the central portion of the wafer W, while the spin chuck 42 is being rotated, for example, at a rotation number of 1500 rpm, the masking film removing nozzle 55 may discharge (supply) the removing solution, for example, the developing solution D to the central portion of the wafer W, for example, for 10 seconds to diffuse the developing solution D by the centrifugal force to thereby dissolve and remove the masking film M formed at the edge portion of the front surface of the wafer W.

Figure 13:
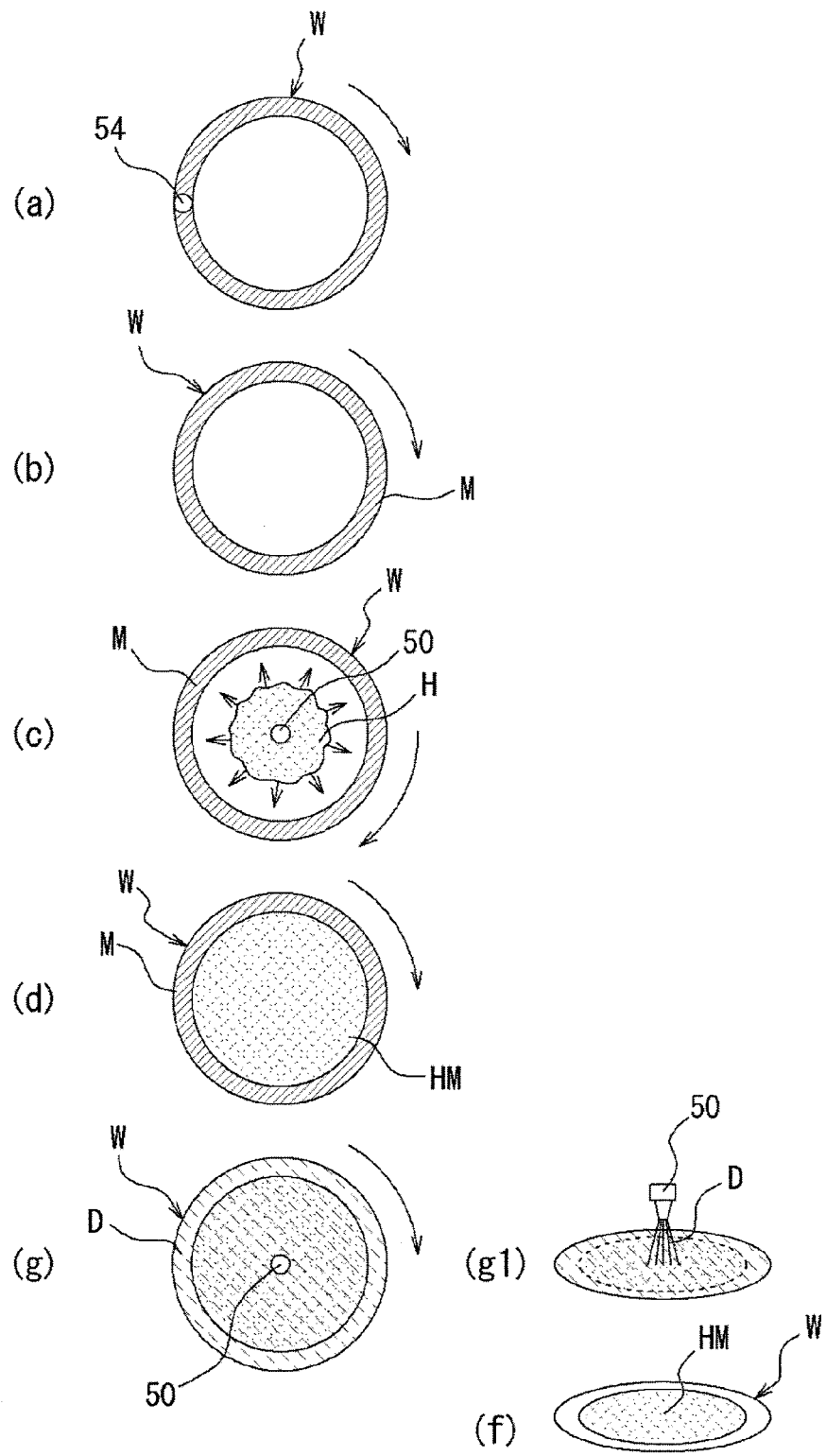
FIG. 13 illustrates schematic plan views and schematic perspective views illustrating another example of the treatment procedure of the coating treatment method according to this invention.
Figure 14:
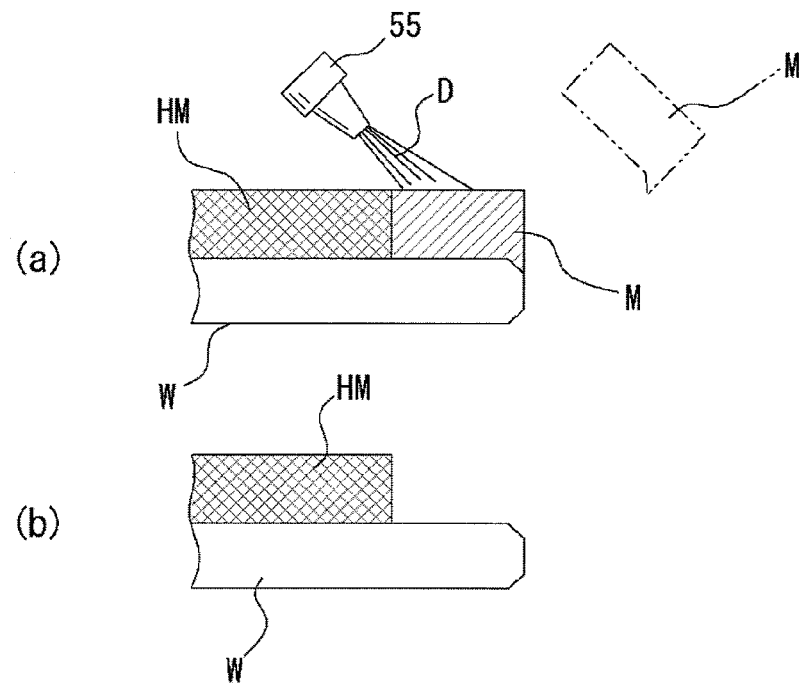
FIG. 14 illustrates schematic cross-sectional views illustrating another example of the removing step of the masking film in this invention.

Note that since the other parts in FIG. 13 are the same as those in FIG. 12, the same parts are given the same numerals and symbols, and description thereof will be omitted.

Figure 15:
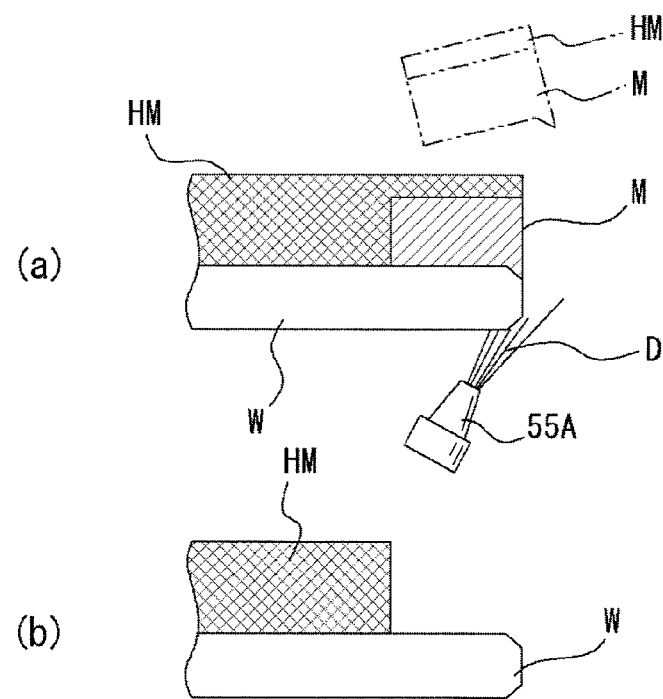
FIG. 15 illustrates schematic cross-sectional views illustrating still another example of the removing step of the masking film in this invention.

The case where the masking film removing nozzle 55 discharges (supplies) the removing solution, for example, the developing solution D to the edge portion of the wafer W to remove the masking film M has been described in the above embodiment. However, in the case where the hard mask film HM is piled on the front surface of the masking film M and the case where the hard mask film HM extends around to the beveled portion of the wafer W, that is, a portion obtained by chamfering a portion forming an elevation angle at the peripheral end portion of the wafer W and to the rear surface, the masking film M and the hard mask film HM adhering to the masking film M can be removed by discharging (supplying) the masking film removing solution, for example, the developing solution D to the edge portion (beveled portion) on the rear surface side of the wafer W from the rear surface masking film removing nozzle 55A as illustrated in FIG. 15.

Figure 10A:
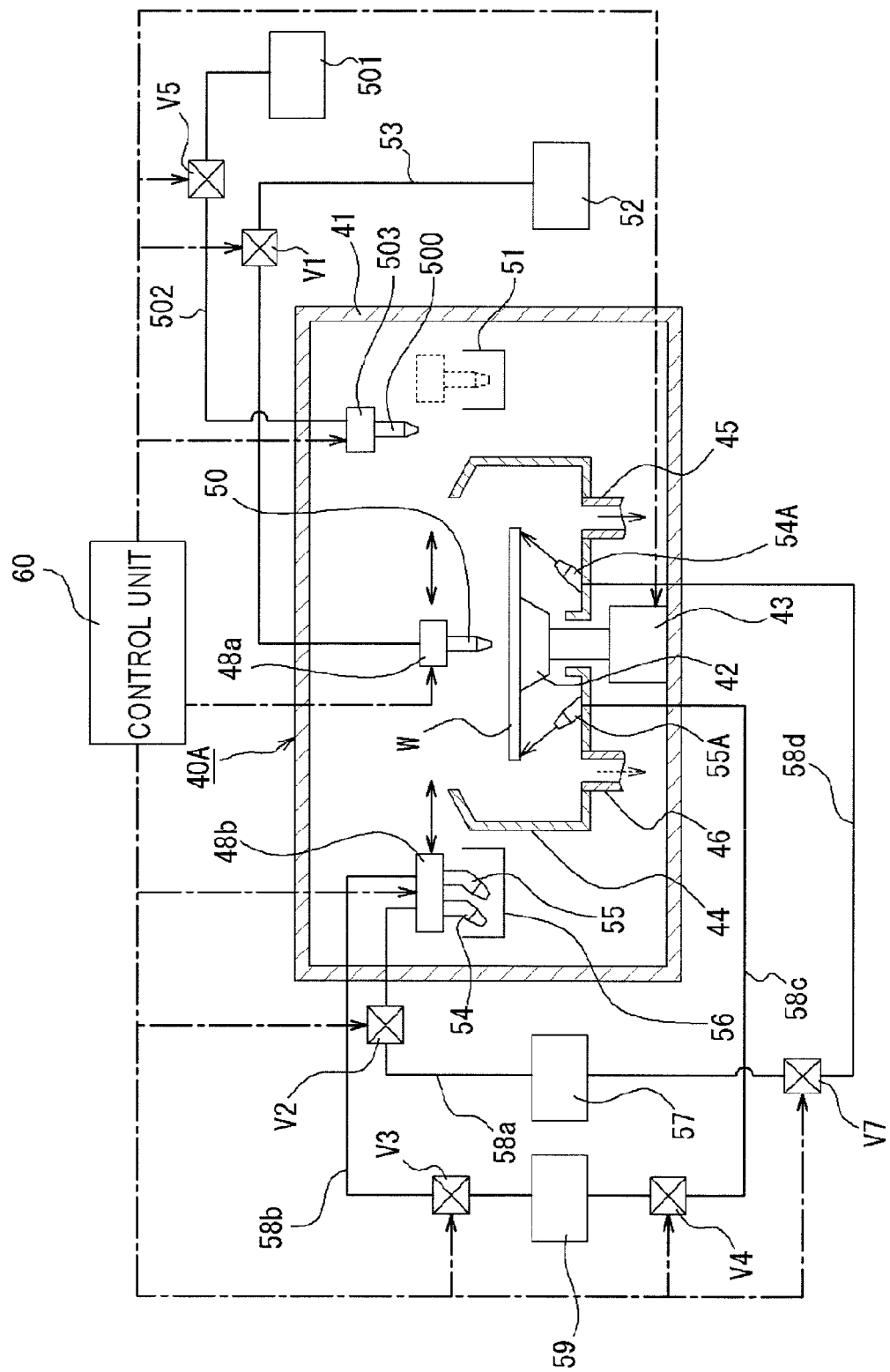
FIG. 10A is a cross-sectional view in which a rear surface masking solution supply nozzle is added to the coating treatment apparatus of the second embodiment.

On the assumption that the hard mask solution H flows around to edge portion of the rear surface of the wafer W, an auxiliary masking solution supply part may be provided which supplies the masking solution to the edge portion on the rear surface side of the wafer W. For example, as illustrated in FIG. 10A, a rear surface masking solution supply nozzle 54A (hereinafter, referred to as a rear surface masking nozzle 54A) which is the auxiliary masking solution supply part that supplies (discharges) the masking solution, for example, a photoresist solution toward the edge portion on the rear surface side of the wafer W is arranged at the bottom of the treatment cup 44. To the rear surface masking nozzle 54A, an auxiliary masking solution supply pipe 58d connected to a masking solution supply source 57 is connected as illustrated in FIG. 10A. The auxiliary masking solution supply pipe 58d is provided with a seventh opening/closing valve V7 having a flow rate adjusting function. The seventh opening/closing valve V7 is electrically connected to the control unit 60 and driven and controlled based on a control signal from the control unit 60. Note that since the other parts in FIG. 10A are the same as those in the first embodiment, the same parts are given the same numerals and symbols, and description thereof will be omitted.

Figure 16:
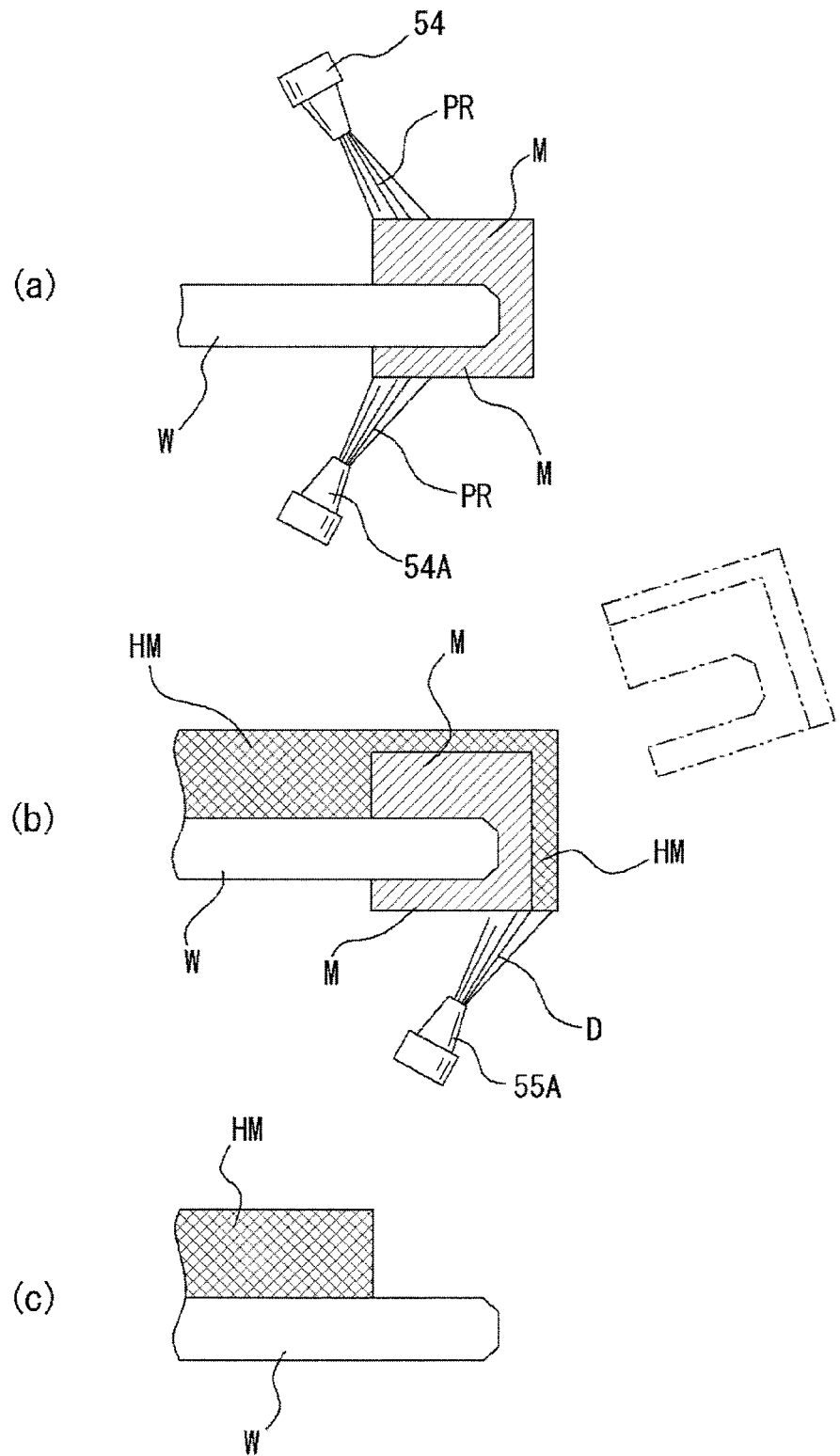
FIG. 16 illustrates schematic cross-sectional views illustrating yet another example of the removing step of the masking film in this invention.

With the above configuration, the rear surface masking nozzle 54A can discharge (supply) the masking solution (negative photoresist solution PR) to the edge portion of the rear surface of the wafer W to form the masking film M at the edge portion of the rear surface of the wafer W as illustrated in FIG. 16(*a*). Accordingly, even if the hard mask film HM extends around to the edge portion of the rear surface of the wafer W, the masking film M and the hard mask film HM adhering to the masking film M can be removed by discharging (supplying) the removing solution, for example, the developing solution D to the edge portion (beveled portion) on the rear surface side of the wafer W from the rear surface masking film removing nozzle 55A as illustrated in FIG. 16(*b*), (*c*).

When the developing solution D is discharged (supplied) to the edge portion (beveled portion) on the rear surface side of the wafer W from the rear surface masking film removing nozzle 55A as described above, the removing solution (developing solution D) comes into contact with the masking film M and permeates the masking film M by capillarity, so that the hard mask film HM adhering to the masking film M is removed together with the masking film M. Note that in this case, the removing solution, for example, the developing solution D may be discharged (supplied) to the edge portion of the wafer W from the masking film removing nozzle 55 in synchronization with the discharge (supply) of the masking film removing solution, for example, the developing solution D to the edge portion (beveled portion) on the rear surface side of the wafer W from the rear surface masking film removing nozzle 55A. Thus, the masking film M and the hard mask film HM adhering to the masking film M can be surely removed.

Figure 17:
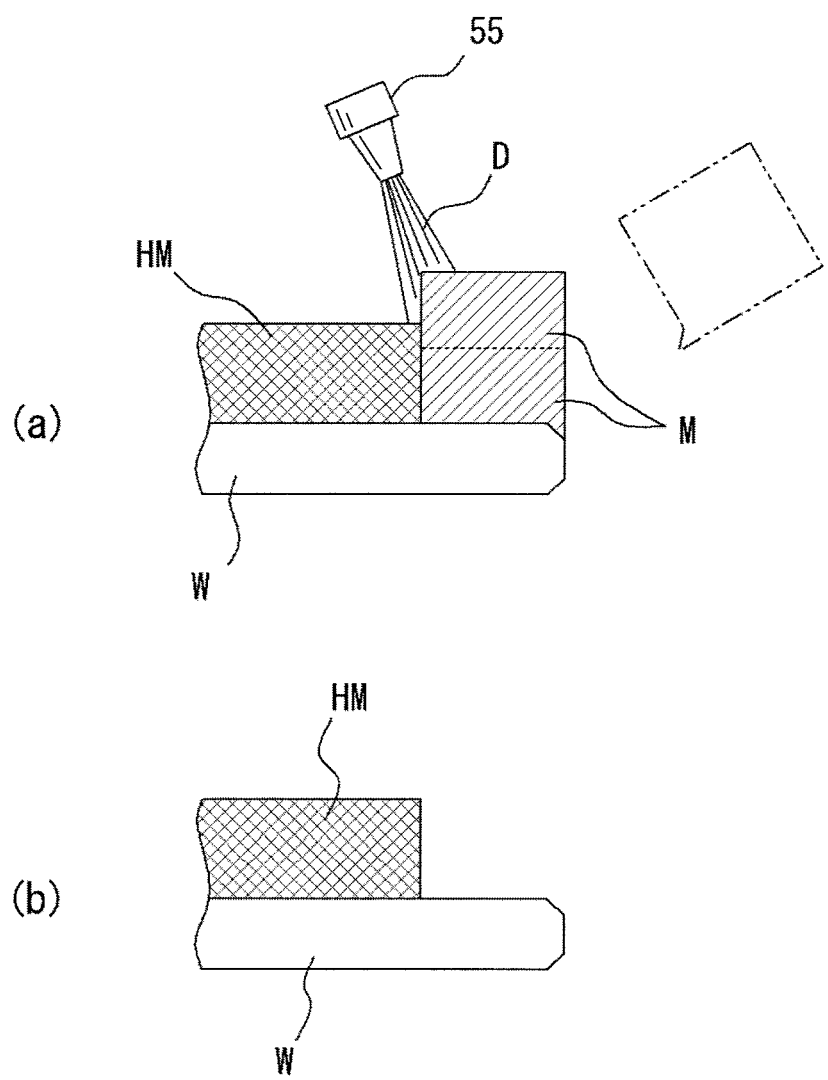
FIG. 17 illustrates schematic cross-sectional views illustrating further another example of the removing step of the masking film in this invention n.

To prevent a phenomenon that the hard mask film HM is piled on the front surface of the masking film M and a phenomenon that the hard mask film HM extends around to the beveled portion and the rear surface of the wafer W, it is preferable to make the film thickness of the masking film M large. The case where the masking film forming step and the masking film drying step are performed once to form the masking film M at the edge portion of the wafer W has been described in the above embodiment, the masking film forming step and the masking film drying step may be performed twice to stack the masking films M as illustrated by a two-dotted chain line in FIG. 18, thereby preventing the hard mask film HM from piling and extending around to the rear surface. In this case, the masking film M can be removed by discharging (supplying) the masking film removing solution, for example, the developing solution D to the edge portion of the wafer W from the masking film removing nozzle 55 as illustrated in FIG. 17.

Third Embodiment

Figure 19:
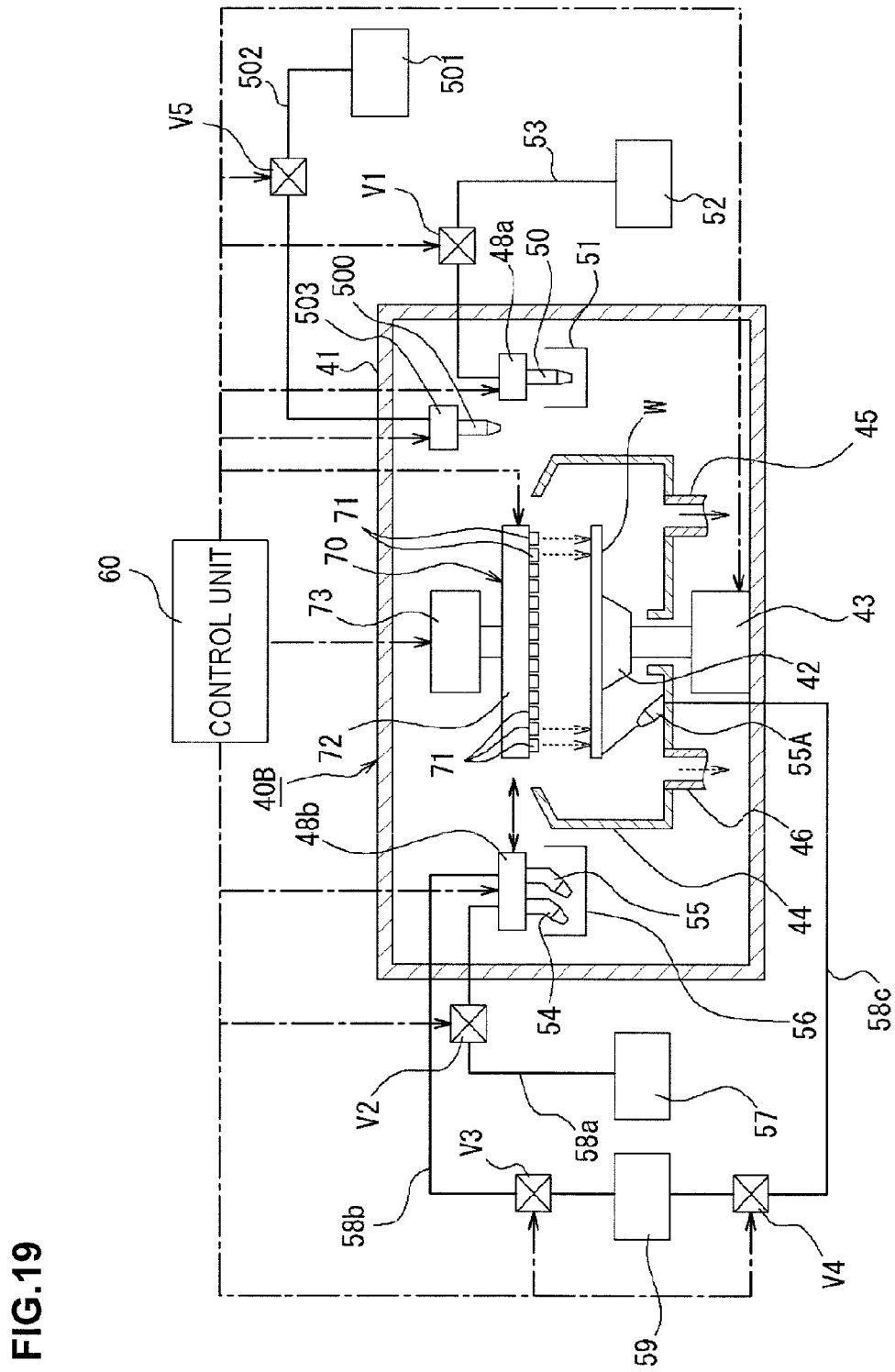
FIG. 19 is a cross-sectional view illustrating a third embodiment of a coating treatment apparatus according to this invention.

FIG. 19 is a cross-sectional view illustrating a third embodiment of the coating treatment apparatus according to this invention. A coating treatment apparatus 40B of the third embodiment is an example in which drying of the masking film and the hard mask film is performed by heat treatment.

The coating treatment apparatus 40B of the third embodiment includes, as in the first embodiment, a heating body, for example, an LED illumination heating body 70 that is arranged above the opening of a treatment cup 44, and a heating body moving mechanism 73 that moves the LED illumination heating body 70 to approach and separate to/from the front surface of the wafer W held by a spin chuck 42, and the LED illumination heating body 70 and the heating body moving mechanism 73 are controlled by a control unit 60.

Though detailed description will be omitted, the LED illumination heating body 70 is formed in the same structure as that of the LED illumination heating body in the first embodiment and includes a plurality of LEDs 71 arranged on the same plane and a control power supply 72 that controls power feeding to the LEDs 71. In this case, the LEDs 71 only need to output a wavelength capable of drying by heating the masking film M and the hard mask film HM, for example, a wavelength of 800 nm to 900 nm. Note that since the other parts in the third embodiment are the same as those in the first and second embodiments, the same parts are given the same numerals and symbols, and description thereof will be omitted.

Figure 20:
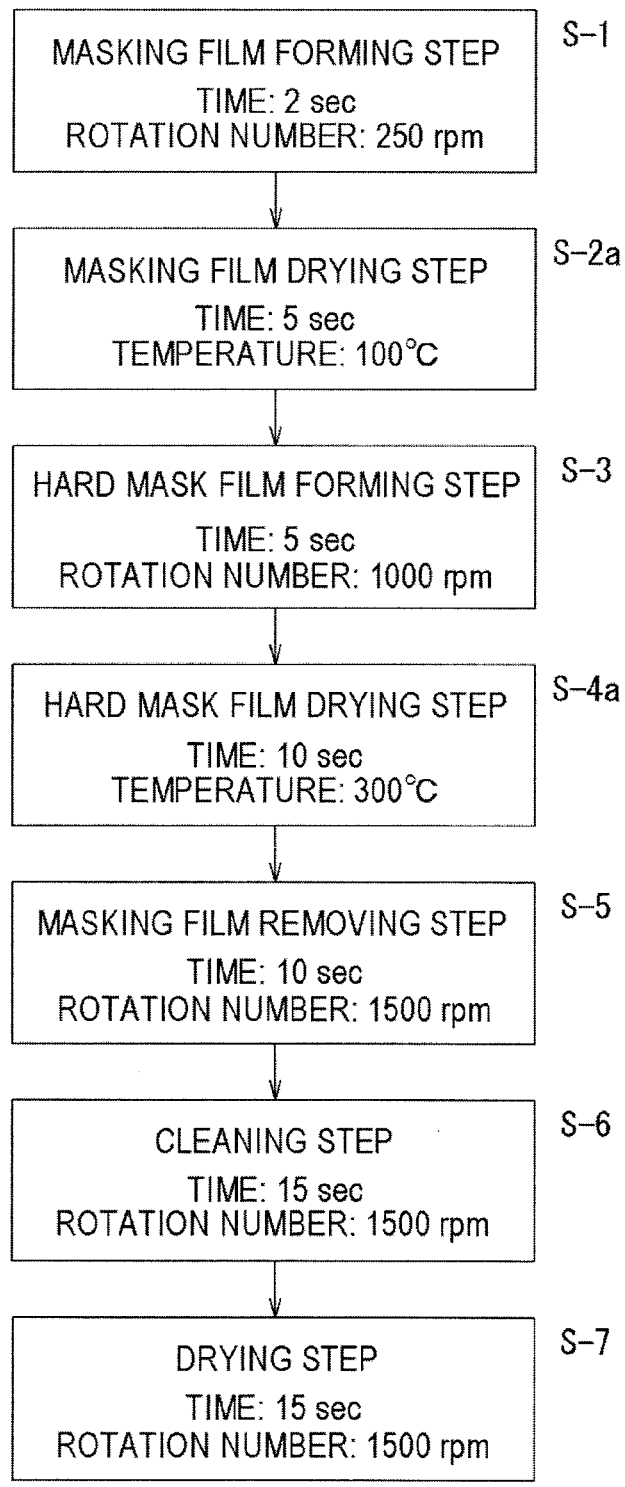
FIG. 20 is a flowchart illustrating a coating treatment method of the third embodiment.

Next, a treatment process performed in the coating treatment apparatus 40B of the third embodiment configured as described above will be described. FIG. 20 is a flowchart illustrating main steps of the treatment process in the coating treatment apparatus 40B. Note that the same parts as those in the second embodiment among steps described below will be described by providing the same numerals and symbols and the drawing (FIG. 12).

(Step S-1) First, the wafer W carried by a carrier arm A1 is held by the spin chuck 42. A masking nozzle 54 is moved to above the edge portion of the wafer W. In this state, while the spin chuck 42 is being rotated, for example, at a rotation number of 250 rpm, the masking nozzle 54 discharges (supplies) a masking solution, for example, a negative photoresist solution PR to the edge portion of the wafer W, for example, for two seconds. The negative photoresist solution PR diffuses to the edge portion of the wafer W by the centrifugal force to form the masking film M at the edge portion of the front surface of the wafer W {masking film forming step: see FIG. 5B(*a*), FIG. 12(*a*), (*a*1)}.

(Step S-2*a*) Then, the LED illumination heating body 70 is moved to above the front surface of the wafer W, in which state the rotation of the spin chuck 42 is stopped and heat energy generated by converting light radiated from the LEDs 71 is used to heat and dry the masking film M formed at the edge portion of the front surface of the wafer W, for example, at 100° C. for five seconds {masking film drying step}.

(Step S-3) After the masking film M is heated and dried, a hard mask nozzle 50 is moved to above the central portion of the wafer W. While the spin chuck 42 is being rotated, for example, at a rotation number of 1000 rpm, the hard mask nozzle 50 discharges (supplies) a hard mask solution H to the central portion of the wafer W, for example, for five seconds. Thus, the hard mask solution H diffuses over the front surface of the wafer W to form the hard mask film TIM on the front surface of the wafer W {hard mask film forming step: see FIG. 12(*c*), (*c*1)}.

(Step S-4*a*) Then, the LED illumination heating body 70 is moved to above the front surface of the wafer W, and heat energy generated by converting light radiated from the LEDs 71 is used to heat and dry the hard mask film HM formed on the front surface of the wafer W, for example, at 300° C. for 10 seconds {hard mask film drying step}.

(Step S-5) After the hard mask film HM is dried, a masking film removing nozzle 55 is moved to above the edge portion of the wafer W. In this state, while the spin chuck 42 is being rotated, for example, at a rotation number of 1500 rpm, the masking film removing nozzle 55 discharges (supplies) a removing solution, for example, a developing solution D dissolving a masking film (negative photoresist film) to the edge portion of the wafer W, for example, for 10 seconds. The developing solution D diffuses to the edge portion of the wafer W by the centrifugal force to dissolve and remove the masking film M formed at the edge portion of the front surface of the wafer W {masking film removing step: see FIG. 12(*e*), (*e*1), (*f*) and FIG. 14}.

After the masking film M formed at the edge portion of the wafer W is removed as described above, a cleaning nozzle 500 is moved to above the edge portion of the wafer W. In this state, while the spin chuck 42 is being rotated, for example, at a rotation number of 1500 rpm, the cleaning nozzle 500 discharges (supplies) a cleaning solution, for example, deionized water (DIW) to the edge portion of the wafer W, for example, for 15 seconds to remove the masking film remaining at the edge portion of the wafer W {Step S-6: cleaning step}. After the cleaning step, the spin chuck 42 is rotated, for example, at a rotation number of 1500 rpm, for example, for 15 seconds to dry the cleaning solution by spinning it off, with which the treatment ends {Step S-7: drying step}.

A series of Steps S-1, S-2*a*, S-3, S-4*a*, S-5 to S-7 described above are executed by a control computer reading control programs stored in the memory of the control computer in a control unit 60 and outputting control signals for operating the already-described mechanisms based on read commands.

OTHER EMBODIMENTS

This invention have been described above with reference to some embodiment, but this invention is not limited to the embodiments and may be variously modified within the matters included in the scope of attached claims.

For example, the case where the masking film drying step and the hard mask film drying step are performed by the LED illumination heating body 70 arranged in the coating treatment apparatus 40B has been described in the third embodiment, but the wafer W may be carried, after the masking film forming step and after the hard mask film forming step, from the coating treatment apparatus 40B to a dedicated heat treatment module, for example, one of the heating modules 28 in the thermal treatment module 27 and subjected to the masking film drying step and the hard mask film drying step in the second embodiment.

Further, the case where the masking film heating step and the hard mask film heating step are performed by the LED illumination heating body 70 arranged in the coating treatment apparatus 40 has been described in the first embodiment, but the wafer W may be carried, after the masking film forming step and after the hard mask film forming step, from the coating treatment apparatus 40 to a dedicated heat treatment module, for example, one of the heating modules 28 in the thermal treatment module 27 and subjected to the masking film heating step and the hard mask film drying step in the first embodiment.

Further, the case where the masking solution is the negative photoresist solution has been described in the above embodiments, but a liquid-immersion upper layer protective film solution (for example, an organic polymer containing fluorine) or an upper anti-reflection film solution other than the negative photoresist solution may be used as the masking solution.

Further, the case where the masking film removing solution is the developing solution dissolving the negative photoresist film has been described in the above embodiments, but, for example, the developing solution dissolving the liquid-immersion upper layer protective film, water or 2-propanol dissolving the upper anti-reflection film may be used as other removing solutions.

Further, though the case where the masking solution is the negative photoresist solution has been described in the above embodiments, the positive photoresist solution can also be used as the masking solution. In this case, the developing solution, for example, tetramethylammonium hydroxide solution (TMAH) dissolving the positive photoresist film is used as the removing solution. In the case where the positive photoresist solution is used as the masking solution, the positive photoresist solution is applied to the front surface of the wafer W to form the masking film, and then the wafer W is carried to the edge exposure module WEE in which the masking film formed at the edge portion of the front surface of the wafer W is exposed to be made soluble in the removing solution (TMAH). Thereafter, the wafer W is carried to the hard mask film forming module HMCT in which a hard mask is formed as in the above embodiments and dried. Then, while the wafer W is being rotated, the removing solution (TMAH) dissolving the positive photoresist film is discharged (supplied) to the edge portion of the rear surface of the wafer W to remove the masking film formed at the edge portion of the front surface of the wafer W.

What is claimed is:

1. A coating treatment method of applying a hard mask solution to a front surface of a substrate to form a hard mask film, comprising:
   a masking film forming step of supplying a masking solution to an edge portion of the front surface of the substrate rotated around a vertical axis to form a masking film at the edge portion of the substrate;
   a hard mask film forming step of supplying the hard mask solution to the front surface of the substrate to form the hard mask film on the front surface of the substrate;
   a hard mask film removing step of supplying a hard mask film removing solution dissolving the hard mask film to the hard mask film formed at the edge portion of the substrate to remove the hard mask film at the edge portion of the substrate; and
   a masking film removing step of supplying a masking film removing solution dissolving the masking film to the masking film to remove the masking film at the edge portion of the substrate.

2. The coating treatment method as set forth in claim 1, wherein the hard mask film removing solution and the masking film removing solution are different treatment solutions.

3. The coating treatment method as set forth in claim 1, wherein the hard mask film removing solution is a treatment solution that does not dissolve the masking film.

4. The coating treatment method as set forth in claim 1, further comprising:
   a hard mask film heating step of heat-treating the hard mask film after the hard mask film removing step and before the masking film removing step.

5. The coating treatment method as set forth in claim 1, wherein the hard mask solution is a hard mask solution containing an organic substance or containing an organic substance and an inorganic substance.

6. The coating treatment method as set forth in claim 1, wherein the masking film removing solution is a treatment solution that does not dissolve the hard mask film.

7. A coating treatment method of applying a hard mask solution to a front surface of a substrate to form a hard mask film, comprising:
   a masking film forming step of supplying a masking solution to an edge portion of the front surface of the substrate rotated around a vertical axis to form a masking film at the edge portion of the substrate;
   a hard mask film forming step of supplying the hard mask solution to the front surface of the substrate to form the hard mask film on the front surface of the substrate; and
   a masking film removing step of supplying a masking film removing solution dissolving the masking film to the masking film to remove the masking film at the edge portion of the substrate and remove the hard mask film adhering to the masking film.

8. The coating treatment method as set forth in claim 7, wherein the masking film forming step includes supplying a masking solution to an edge portion of a rear surface of the substrate to form an auxiliary masking film at the edge portion of the rear surface of the substrate.

9. The coating treatment method as set forth in claim 7, wherein the masking film forming step is repeated to stack the masking films.

10. The coating treatment method as set forth in claim 7, wherein the hard mask solution is a hard mask solution containing an organic substance or containing an organic substance and an inorganic substance.

11. The coating treatment method as set forth in claim 7, wherein the masking film removing solution is a treatment solution that does not dissolve the hard mask film.

12. A coating treatment apparatus for applying a hard mask solution to a front surface of a substrate to form a hard mask film, comprising:
   a substrate holding part that horizontally holds the substrate;
   a rotation mechanism that rotates the substrate holding part around a vertical axis;
   a masking solution supply part that supplies a masking solution to an edge portion of the front surface of the substrate;
   a hard mask solution supply part that supplies the hard mask solution to the front surface of the substrate;
   a hard mask film removing solution supply part that supplies a hard mask film removing solution to the hard mask film formed at the edge portion of the substrate;
   a masking film removing solution supply part that supplies a masking film removing solution dissolving the masking film to remove the masking film formed at the edge portion of the front surface of the substrate;
   a first moving mechanism that moves the masking solution supply part between the edge portion of the substrate and an outside of the substrate;
   a second moving mechanism that moves the hard mask solution supply part between a hard mask solution supply position and an outside of the substrate;
   a third moving mechanism that moves the masking film removing solution supply part between the edge portion of the substrate and an outside of the substrate;
   a fourth moving mechanism that moves the hard mask film removing solution supply part between the edge portion of the substrate and an outside of the substrate; and
   a control unit that drives the rotation mechanism, the masking solution supply part, the hard mask solution supply part, and the first to fourth moving mechanisms,
   wherein the control unit is configured to supply the masking solution to the edge portion of the front surface of the rotated substrate to form the masking film at the edge portion of the substrate, then supply the hard mask solution to the front surface of the substrate to form the hard mask film on the front surface of the substrate, then supply the hard mask film removing solution dissolving the hard mask film to the hard mask film formed at the edge portion of the substrate to remove the hard mask film at the edge portion of the substrate, and then supply the masking film removing solution to the masking film to remove the masking film at the edge portion of the substrate.

13. The coating treatment apparatus as set forth in claim 12, further comprising:
   a heating part that heats the hard mask film,
   wherein the control unit controls driving of the heating part and is configured to cause the heating part to heat-treat the hard mask film after the hard mask film formed at the edge portion of the substrate is removed and before the masking film is removed.

14. The coating treatment apparatus as set forth in claim 12, wherein the hard mask film removing solution and the masking film removing solution are different treatment solutions.

15. The coating treatment apparatus as set forth in claim 12, wherein the hard mask film removing solution is a treatment solution that does not dissolve the masking film.

16. The coating treatment apparatus as set forth in claim 12, wherein the hard mask solution is a hard mask solution containing an organic substance or containing an organic substance and an inorganic substance.

17. The coating treatment apparatus as set forth in claim 12, wherein the masking film removing solution is a treatment solution that does not dissolve the hard mask film.

18. A coating treatment apparatus for applying a hard mask solution to a front surface of a substrate to form a hard mask film, comprising:
   a substrate holding part that horizontally holds the substrate;
   a rotation mechanism that rotates the substrate holding part around a vertical axis;
   a masking solution supply part that supplies a masking solution to an edge portion of the front surface of the substrate;
   a hard mask solution supply part that supplies the hard mask solution to the front surface of the substrate;
   a masking film removing solution supply part that supplies a masking film removing solution dissolving the masking film to remove the masking film formed at the edge portion of the front surface of the substrate;
   a first moving mechanism that moves the masking solution supply part between the edge portion of the substrate and an outside of the substrate;
   a second moving mechanism that moves the hard mask solution supply part between a hard mask solution supply position and an outside of the substrate;
   a third moving mechanism that moves the masking film removing solution supply part between the edge portion of the substrate and an outside of the substrate; and
   a control unit that drives the rotation mechanism, the masking solution supply part, the hard mask solution supply part, and the first to third moving mechanisms,
   wherein the control unit is configured to supply the masking solution to the edge portion of the front surface of the rotated substrate to form the masking film at the edge portion of the substrate, then supply the hard mask solution to the front surface of the substrate to form the hard mask film on the front surface of the substrate, and then supply the masking film removing solution to the masking film to remove the masking film at the edge portion of the substrate and remove the hard mask film adhering to the masking film.

19. The coating treatment apparatus as set forth in claim 18, further comprising:
   an auxiliary masking solution supply part that supplies a masking solution to an edge portion on a rear surface side of the substrate.

20. The coating treatment apparatus as set forth in claim 18, wherein the hard mask solution is a hard mask solution containing an organic substance or containing an organic substance and an inorganic substance.

21. The coating treatment apparatus as set forth in claim 18, wherein the masking film removing solution is a treatment solution that does not dissolve the hard mask film.

* * * * *